US009607691B1

(12) United States Patent
Allegra et al.

(10) Patent No.: US 9,607,691 B1
(45) Date of Patent: Mar. 28, 2017

(54) MEMORY CELL ARCHITECTURE FOR MULTILEVEL CELL PROGRAMMING

(71) Applicant: MICRON TECHNOLOGY, INC., Boise, ID (US)

(72) Inventors: Mario Allegra, Milan (IT); Mattia Boniardi, Cormano (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/046,330

(22) Filed: Feb. 17, 2016

(51) Int. Cl.
*G11C 16/04* (2006.01)
*G11C 11/56* (2006.01)

(52) U.S. Cl.
CPC ...... *G11C 11/5628* (2013.01); *G11C 11/5642* (2013.01)

(58) Field of Classification Search
CPC ............ G11C 13/0004; G11C 13/0028; G11C 2213/79; G11C 8/08; G11C 8/10; G11C 11/5678; G11C 2213/53; H01L 45/06; H01L 45/144; H01L 27/2436; H01L 45/1226; H01L 45/1675; H01L 27/2463; H01L 45/1233; H01L 45/143; H01L 45/148; H01L 45/1625; H01L 45/165; H01L 27/2427
USPC ................ 365/163, 148, 100, 129, 171, 173
See application file for complete search history.

(56) References Cited

U.S. PATENT DOCUMENTS

| 8,964,448 | B2 | 2/2015 | Russo et al. |
| 9,130,157 | B2 | 9/2015 | Gotti et al. |
| 2009/0231910 | A1* | 9/2009 | Liu ..................... H01L 27/2427 365/163 |
| 2015/0123066 | A1 | 5/2015 | Gealy et al. |

OTHER PUBLICATIONS

Kau et al. "A Stackable cross point phase change memory," 2009, IEDM 09-617 et seq., IEEE.

* cited by examiner

*Primary Examiner* — Thong Q Le
(74) *Attorney, Agent, or Firm* — Holland & Hart LLP

(57) ABSTRACT

Methods, systems, and devices for operating and forming a multilevel memory cell and array are described. A multilevel memory cell includes two or more binary memory elements, which may include phase change material. Each memory element may be programmed to one of two possible states—e.g., a fully amorphous state or a fully crystalline state. By combining multiple binary memory elements in a single memory cell, the memory cell may be programmed to store more than two states. The different memory elements may be programmed by selectively melting each memory element. Selective melting may be controlled by using memory elements with different melting temperatures or using electrodes with different electrical resistances, or both.

27 Claims, 13 Drawing Sheets

MEMORY CELL ARCHITECTURE FOR MULTILEVEL CELL PROGRAMMING

BACKGROUND

The following relates generally to memory devices and more specifically to memory cell architecture for multilevel cell programming.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., PCM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

Phase change memory may be non-volatile and may offer improved read/write speeds and endurance compared to other memory devices, as well as increased memory cell density. In some cases, increasing memory cell density may be technologically unfeasible or cost prohibitive, limiting the number of bits per unit area in a memory array. Instead, other methods for increasing a number of bits per unit area may reduce memory array cost or increase performance.

BRIEF DESCRIPTION OF THE DRAWINGS

The disclosure herein refers to and includes the following figures.

DETAILED DESCRIPTION

Figure 1:
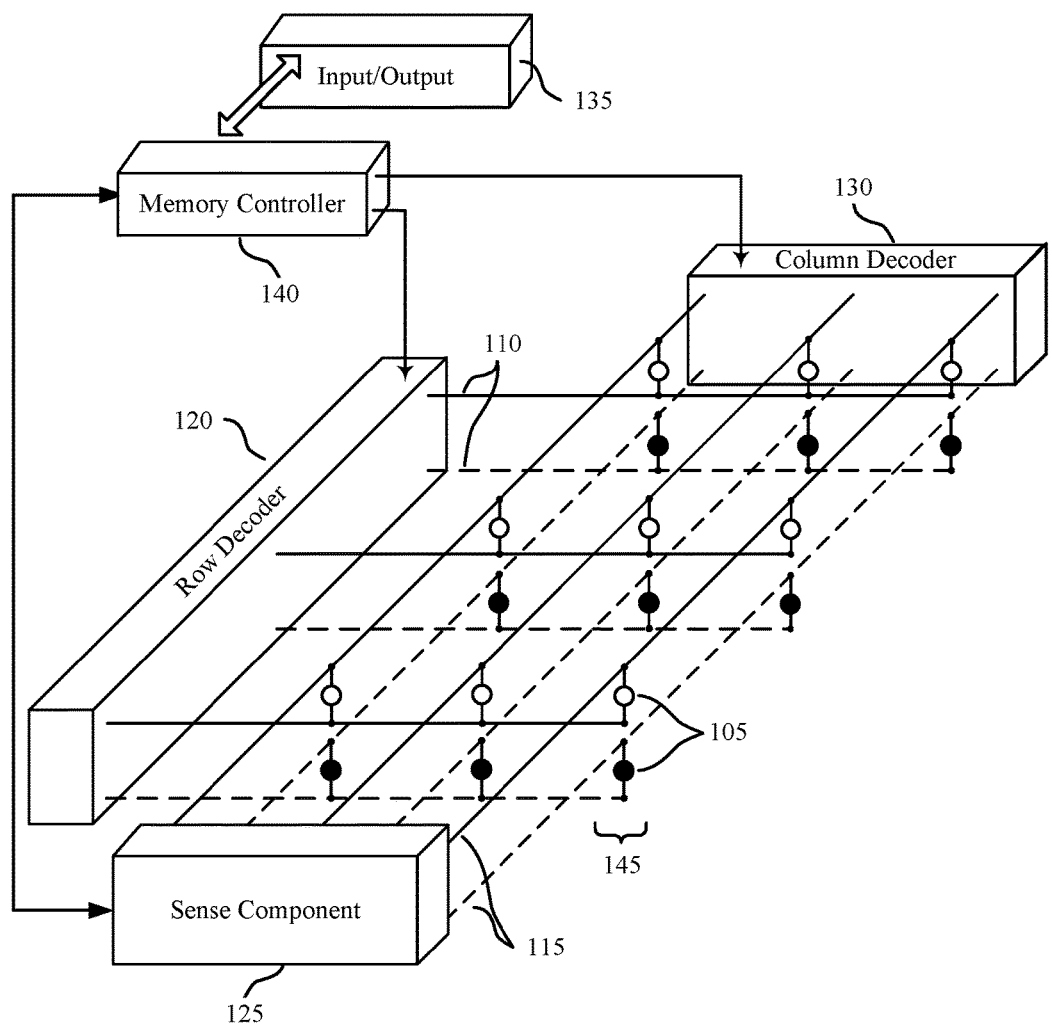
FIG. 1 illustrates an example memory array that supports multilevel memory cell architecture and programming in accordance with various embodiments of the present disclosure.

Increasing the amount of information stored within an array that occupies a given area of planar substrate may provide for increased performance or capability of the array. As described herein, memory cell density may be increased by employing memory cells with multiple memory elements, and each memory element may be programmable to store a logic state. As discussed below, such multilevel cells, and the techniques described herein, may provide for increased density in a manner that is more efficient and reliable than other options for increased cell density.

Oftentimes, increased cell density is achieved by reduction in the size of memory cell components, decreasing the area any single cell occupies. To increase the number of cells within a given area, the size of each cell may be reduced; and to accommodate a larger number of cells, additional components may be added to the array. These memory cells may be binary, i.e., they may be configurable to store one of two possible states. Binary memory may be preferable for some deployments due in part to the stability of the stored state. But decreasing memory cell size and increasing the number of components in an array may be cost prohibitive or difficult to rapidly scale for production.

Memory cells capable of storing more than two possible states may provide another avenue for increasing cell density. But memory cells capable of storing more than one state may be difficult to operate. For example, a magnetic material may be magnetized in one of two directions. These two states may be low-energy states or local energetic minima— i.e., a stored state will return to the local minimum despite a small deviation from the minimum. In such materials, a third, intermediate state, for example, a net zero magnetization, may be difficult to store after it is created. The intermediate state may not be stable, i.e., it may not represent a local energy minimum, and a disturbance may result in the intermediate state reverting to a low energy state, ultimately changing the stored state.

Furthermore, consistently creating an intermediate state may be challenging. If the intermediate state is not a local energetic minimum, it may be sensitive to any variation in programming, resulting in variations in the stored state among different write cycles. Since a commercially implemented memory cell may be programmed more than one million times during its life, achieving a precise intermediate state each time may not be feasible, rendering the intermediate state useless.

Reliably and efficiently leveraging memory cells capable of storing more than two logic states may thus be helpful in effectively increasing memory density. So as described herein, a memory cell may contain multiple memory elements, and each memory element may be programmed to one of two states (e.g., each memory element of a cell is binary). By combining multiple binary memory elements in a single memory cell, the memory cell may be capable of storing more than two possible states. This may increase memory cell density without a further reduction in component size and without increasing in the number of components in an array, including various bit lines, word lines, electrodes, drivers, etc., used to operate each memory cell.

A multilevel cell (MLC) may contain two or more memory elements, each separated by an electrode. The memory elements may include phase change material. Logic states in phase change memory may be set by controlling the electrical resistance of a memory cell. This may include melting and then cooling a memory element of the memory cell to create an amorphous state with a high resistance. Or, a memory element may be heated to moderately high temperatures to create a crystalline state with a low electrical resistance. Thus, each memory element may be programmed to a fully crystalline state or a fully amorphous state, and multiple memory elements may be combined in a single memory cell to create a multilevel cell.

In some embodiments, the memory elements of a MLC may have different melting temperatures, and each memory element may be set by heating the MLC to different temperatures, for example, heating by passing an electrical current through the MLC. In some examples, the memory elements may be organized in a stack according to their melting temperature. In some embodiments, memory elements may have the same melting temperature, and the electrical resistance of the electrodes associated with different memory elements may be different. This may provide an alternative way to control the temperature profile of the memory cell, allowing for selective melting of the desired memory element. In some cases, the electrodes may be ordered according to their electrical resistance. An MLC may include both memory elements having different melting temperatures and electrodes having different resistances.

Features and techniques introduced above are further described below in the context of a memory array. Specific examples are then described for various multilevel cell architectures and their formation and operation. These and other features of the disclosure are further illustrated by and described with reference to apparatus diagrams, system diagrams, and flowcharts that relate to memory cell architecture for multilevel cell programming.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. A memory cell 105 may include a material, which may be referred to as a memory element, having a variable and configurable electrical resistance that is representative of the logic states. For example, a material with a crystalline or an amorphous atomic configuration may have different electrical resistances. A crystalline state may have a low electrical resistance and may, in some cases, be referred to as the "set" state. An amorphous state may have a high electrical resistance and may be referred to as the "reset" state. A voltage applied to the memory cell 105 may thus result in different currents depending on whether the material is in a crystalline or an amorphous state, and the magnitude of the resulting current may be used to determine the logic state stored by memory cell 105. In some cases, a material in the amorphous or reset state may have a threshold voltage associated with it—that is, current flows after the threshold voltage is exceed. Thus, if the applied voltage is less than the threshold voltage, no current may flow if the memory element is in the reset state; if the memory element is in the set state, it may not have a threshold voltage (i.e., a threshold voltage of zero) and, thus, a current may flow in response to the applied voltage.

Each memory cell 105 may be programmable to store more than two logic states. For example, each memory cell 105 may have more than one memory element, where each memory element may store one of two states. The combination of multiple memory elements may result in a memory cell 105 being programmable to more than two stored states. For example, the total threshold voltage of the memory cell 105 may be a sum of the threshold voltages of the individually configured memory elements, which may determine the resulting signal when reading a memory cell 105. As discussed below, the logic state of a memory cell 105 may be set by heating, including melting, the memory element(s).

Memory array 100 may be a three-dimensional (3D) memory array, where two-dimensional (2D) memory arrays are formed on top of one another. This may increase the number of memory cells that may be placed or created on a single die or substrate as compared with 2D arrays, which in turn may reduce production costs or increase the performance of the memory array, or both. According to the example depicted in FIG. 1, Memory array 100 includes two levels of memory cells 105; however, the number of levels is not limited to two. Each level may be aligned or positioned so that memory cells 105 may be approximately aligned with one another across each level, forming a memory cell stack 145.

Each row of memory cells 105 is connected to an access line 110, and each column of memory cells 105 is connected to a digit line 115. Thus, one memory cell 105 may be located at the intersection of an access line 110 and a digit line 115. This intersection may be referred to as a memory cell's address. Access lines may also be known as word lines and, in some cases, digit lines may be referred to as a bit lines. References to word lines and bit lines, or their analogues, are interchangeable without loss of understanding or operation. Word lines 110 and bit lines 115 may be substantially perpendicular to one another to create an array.

In a three-dimensional array, each level may have a word line 110 and a bit line 115. In other examples, two levels may share a common word line 110 or bit line 115 (not shown). In some cases, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting a word line 110 and bit line 115. Activating or selecting a word line 110 or a bit line 115 may include applying a voltage or a current to the respective line. Word lines 110 and bit lines 115 may be made of conductive materials, such as metals (e.g., copper, aluminum, gold, tungsten, titanium, etc.), metal alloys, carbon, or other conductive materials, alloys, or compounds. Upon selecting a memory cell 105, the resulting signal may be used to determine the stored logic state. For example, a voltage may be applied and the resulting current may be used to differentiate between the resistive states of the phase change material. In some cases, a first logic state may correspond to no current or a negligibly small current, whereas a second logic state may correspond to a finite current. In some cases, memory cell 105 may contain multiple memory elements, each programmed to a high or low resistive state. The high resistive state may have a threshold voltage associated with it, and the total threshold voltage of the memory cell 105 may be based on the threshold voltage of each memory element, thus more than two states may be stored in each memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

Upon accessing, a memory cell 105 may be read, or sensed, by sense component 125. For example, sense component 125 may be configured to determine the stored logic state of memory cell 105 based on a signal generated by accessing memory cell 105. The signal may include a voltage or electrical current, and sense component 125 may include voltage sense amplifiers, current sense amplifiers, or both. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. For example, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the total threshold voltage of the memory cell 105.

Sense component 125 may include various transistors or amplifiers in order to detect and amplify a signal, which may be referred to as latching. The detected logic state of memory cell 105 may then be output as output 135. In some cases, sense component 125 may be a part of column decoder 130 or row decoder 120. Or, sense component 125 may connected to or in electronic communication with column decoder 130 or row decoder 120.

A memory cell 105 may be set, or written, by similarly activating the relevant word line 110 and bit line 115—i.e., a logic value may be stored in the memory cell 105. Column decoder 130 or row decoder 120 may accept data, for example input 135, to be written to the memory cells 105. In the case of phase change memory, a memory cell 105 is written by heating the memory element, for example, by passing a current through the memory element. Different current magnitudes may be applied to write one or more memory elements of the memory cell 105. For example, one current may write a first memory element but not a second, and a second current may write the second memory element but not the first. In some cases, the second current may write both memory elements. More than two current magnitudes may be used if the memory cell 105 has more than two memory elements. The voltages used to apply a current to a memory cell 105 may depend on the various threshold voltages of the memory elements, and in some cases, a threshold voltage associated with a selection component. This process is discussed in more detail below.

In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as PCM, accessing the memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile PCM cells may have beneficial properties that may result in improved performance relative to other memory architectures. For example, PCM may offer comparable read/write speeds as DRAM but may be non-volatile and may offer increased cell density or multilevel cell programming.

The memory controller 140 may control the operation (read, write, re-write, refresh, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltage potentials or currents used during the operation of memory array 100. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
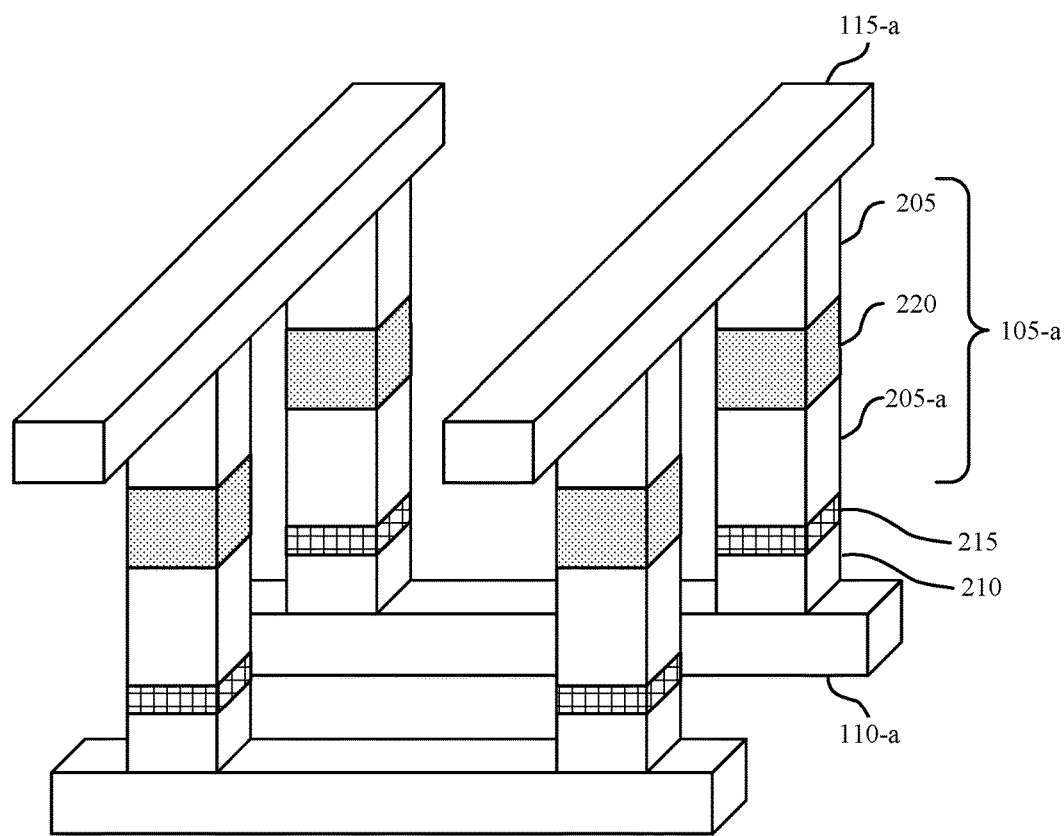
FIG. 2 illustrates an example memory array that supports multilevel memory cell architecture and programming in accordance with various embodiments of the present disclosure.

FIG. 2 illustrates an example memory array 200 that supports multilevel memory cell architecture and programming in accordance with various embodiments of the present disclosure. Memory array 200 may be an example of memory array 100 with reference to FIG. 1. Memory array 200 includes memory cells 105-a, word lines 110-a, and bit lines 115-a, which may be examples of a memory cell 105, word line 110, and bit line 115, as described with reference to FIG. 1. A memory cell 105-a includes electrodes 205 and 205-a and memory element 220. Memory array 200 also includes bottom electrode 210 and selection component 215. The architecture of memory array 200 may be described and understood with reference to axes 225.

Figure 3:
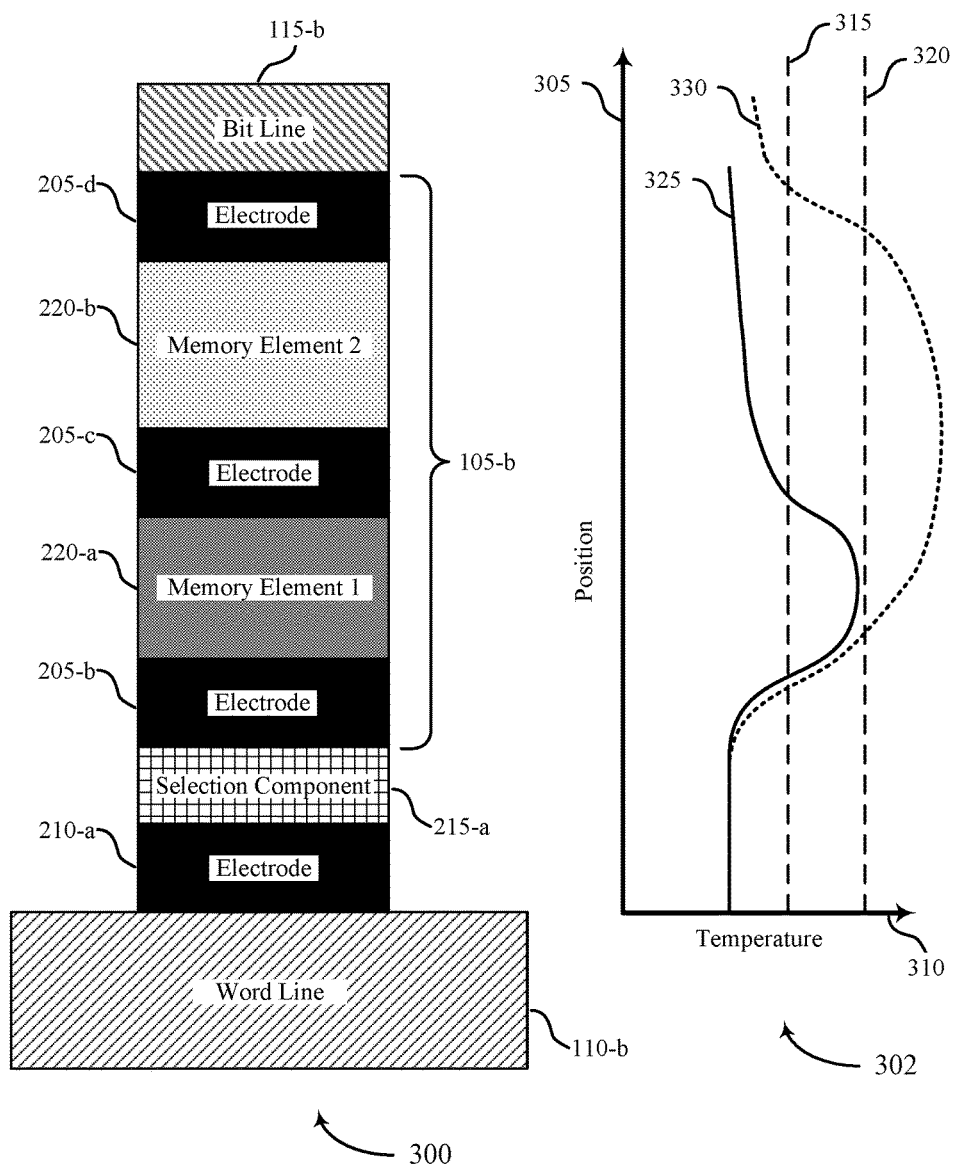
FIG. 3 illustrates an example multilevel memory cell and temperature profiles for multilevel cell programming in accordance with various embodiments of the present disclosure.
Figure 4:
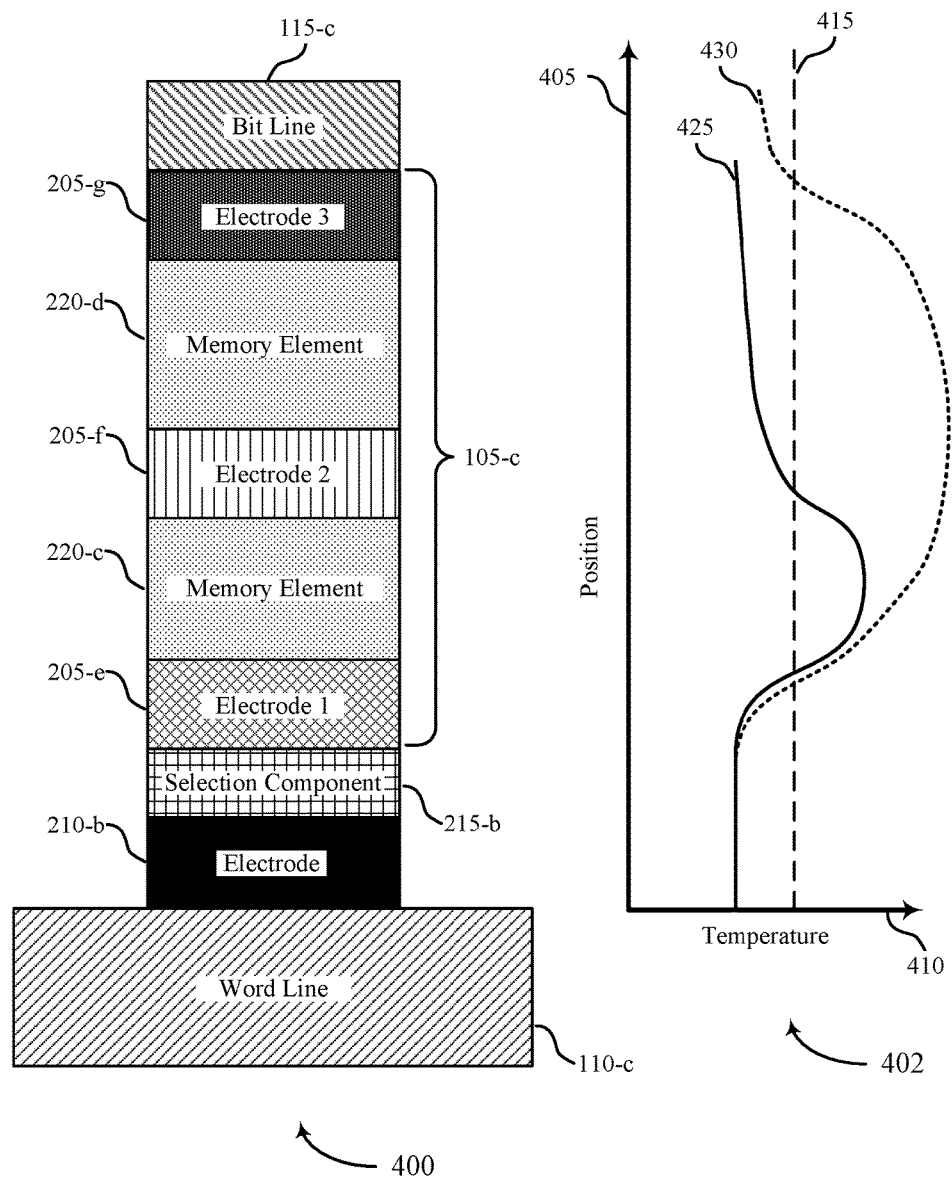
FIG. 4 illustrates an example multilevel memory cell and temperature profiles for multilevel cell programming in accordance with various embodiments of the present disclosure.
Figure 5:
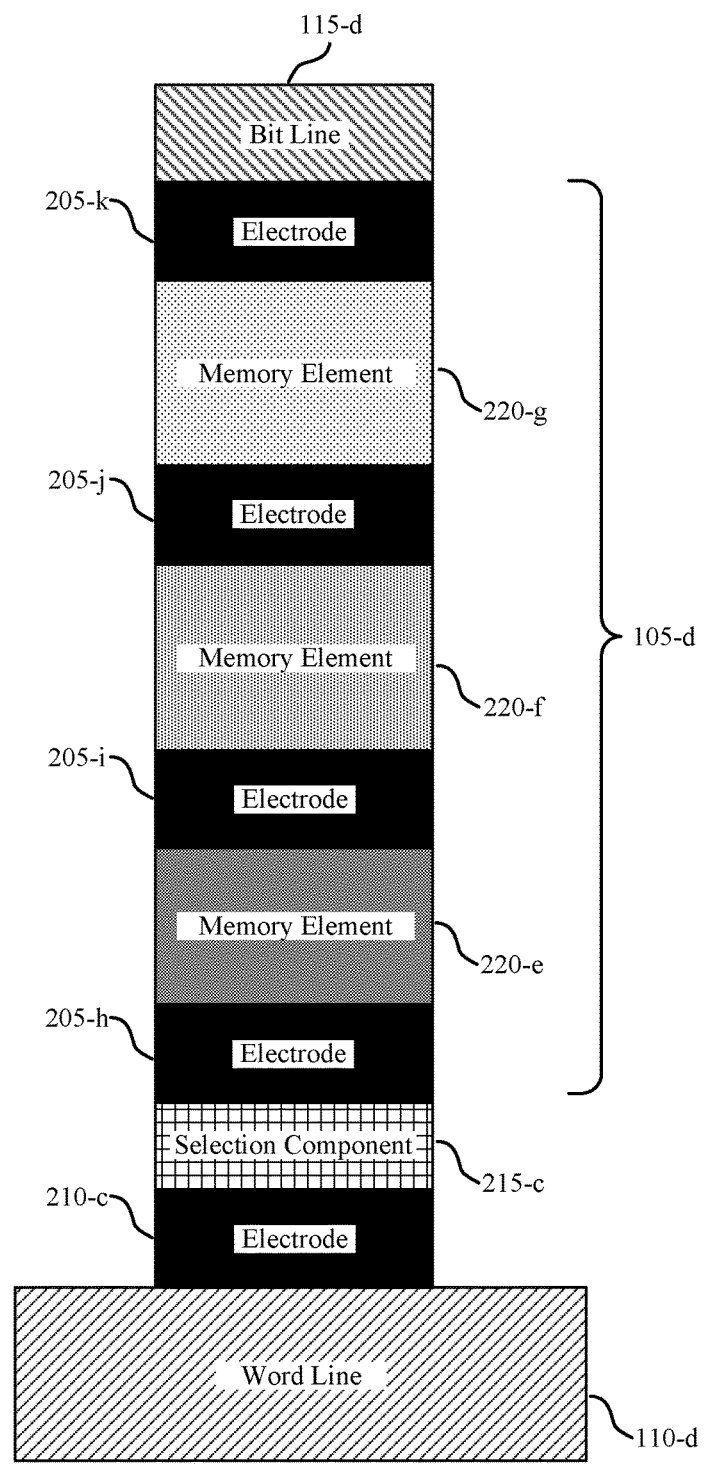
FIG. 5 illustrates an example multilevel memory cell in accordance with various embodiments of the present disclosure.

A 3D memory array may be created by forming multiple memory arrays 200 on top of one another. In some cases, levels may be separated by an electrically insulating material or, in other cases, two levels may have a common word line 110-a or bit line 115-a. For example, another level may be positioned above memory array 200, and bit line 115-a may be common to both levels. As described above, various logic states may be stored by programming the electrical resistance of memory element 220. In some cases, memory cell 105-a may be an MLC and may have multiple memory elements 220, as shown in FIGS. 3-5. Programming memory cell 105-a may include passing a current through memory cell 105-a, heating memory cell 105-a, or melting the memory element 220 wholly or partially.

Memory array 200 may be made by various combinations of material formation and removal. For example, layers of material may be deposited that correspond to the word line 110-a, bottom electrode 210, selection component 215, electrode 205-a, memory element 220, and electrode 205. Material may be selectively removed to then create the desired features, such as the pillar structure depicted in FIG. 2, which also may be known as a cross-point structure. For example, features may be defined using photolithography to pattern a photomask and then material may be removed by techniques such as etching. Bit lines 115-a may be formed, for example, by depositing a layer of material and selectively etching to form the line structure depicted in FIG. 2. In some cases, electrically insulating regions or layers may be formed or deposited between the components. The electrically insulating regions may include oxide or nitride materials, such as silicon oxide, silicon nitride, or other electrically insulating materials.

Selection component 215 may, in some cases, be connected in series between a memory cell 105-a and at least one conducive line such as a word line 110-a or a bit line 115-a. For example, as depicted in FIG. 2, selection component 215 may be located between electrode 205-a and bottom electrode 210; thus, selection component 215 may be located in series between memory cell 105-a and word line 110-a. Other configurations are also possible. For example, selection component 215 may be located in series between memory cell 105-a and bit line 115-a. The selection component may aid in selecting a particular memory cell 105-a or may help prevent stray currents from flowing through non-selected memory cells 105-a adjacent a selected memory cell 105-a. The selection component may include an electrically non-linear component (e.g., a non-ohmic component) such as a metal-insulator-metal (MIM) junction, an ovonic threshold switch (OTS), or a metal-semiconductor-metal (MSM) switch, among other types of two-terminal select device such as a diode. In some cases, the selection component is a chalcogenide film. The selection component may, in some examples, be an alloy of selenium, arsenic, and germanium.

Various techniques may be used to form materials or components of memory array 200. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

As discussed above, memory cells 105-a of FIG. 2 may include a memory element 220 that has a variable electrical resistance. Variable resistance materials may refer to various material systems, including, for example, metal oxides, chalcogenides, and the like. Chalcogenide materials are materials or alloys that include at least one of the elements sulfur (S), selenium (Se), or tellurium (Te). Many chalcogenide alloys may be possible—for example, a germanium-antimony-tellurium alloy (Ge—Sb—Te) is a chalcogenide material. Other chalcogenide alloys not expressly recited here may also be employed.

PCM exploits the large resistance contrast between crystalline and amorphous states in phase change materials, which may be chalcogenide materials. A material in a crystalline state may have atoms arranged in a periodic structure, which may result in a relatively low electrical resistance (e.g., set state). By contrast, material in an amorphous state with no or relatively little periodic atomic structure may have a relatively high electrical resistance (e.g., reset state). The difference in resistance values between amorphous and crystalline states of a material may be significant; for example, a material in an amorphous state may have a resistance one or more orders of magnitude greater than the resistance of the material in its crystalline state. In some cases, the amorphous state may have a threshold voltage associated with it and current may not flow until the threshold voltage is exceeded.

To set a low-resistance state, a memory cell 105-a may be heated by passing a current through the memory cell. Heating caused by electrical current flowing through a material with a finite resistance may be referred to as Joule or ohmic heating. Joule heating may thus be related to the electrical resistance of electrodes or phase change material. Heating the phase change material to an elevated temperature (but below its melting temperature) may result in the phase change material crystallizing and forming the low-resistance state. The current may result from applying a voltage to memory cell 105-a, where the applied voltage is based on the threshold voltage of memory element, the threshold voltage of selection component 215, or their sum. For example, if memory element 220 is in a reset state, current may not flow through memory cell 105-a unless the applied voltage is greater than the sum of the threshold voltages of selection component 215 and memory element 220. In some cases, a memory cell 105-a may be heated by means other than Joule heating, for example, by using a laser.

To set a high-resistance state, the phase change material may be heated above its melting temperature, for example, by Joule heating. The amorphous structure of the molten material may locked in by abruptly removing the applied current to quickly cool the phase change material, which may be known as "quenching." The electrical currents or voltages, or both, used for reading and writing memory cell 105-a may be applied by a memory controller 140.

As described herein, a memory cell 105-a may have more than one memory element 220, which may enable more than two states to be stored in a memory cell 105-a. In other words, the logic state of the memory cell may be based on a combination of the logic states of each memory element. The capability to program or encode more than one bit per cell in a MLC is beneficial because it reduces the area occupied by a single bit and hence further minimizes the information storage cost per unit area. This MLC structure may be particularly beneficial in 3D memory architectures as well.

Multilevel memory cells may be enabled by controlling the melting onset of one or more memory elements 220 in a memory cell 105-a. The melting current, i.e., the magnitude of an electrical current that results in the melting of memory element 220, may be modulated by both the electrodes 205 and 205-a and memory element 220. So the melting onset can be triggered in multiple memory elements 220 by controlling the modulation of the dissipated power (e.g., dissipated heat due to the flow of electrical current) within a memory cell 105-a by controlling the electrical resistance of electrodes 205 and 205-a or by using different materials for memory element 220 (with different melting temperatures). So each memory element 220 may be selectively set to different logic states such that the memory cell 105-a is programmable to more than two states. For example, the total threshold voltage of the memory cell 105-a, including each memory element 220, may determine the signal used to read the stored state in memory cell 105-a.

FIG. 3 illustrates an example multilevel memory cell architecture 300 and temperature plot 302 that supports multilevel cell programming in accordance with various embodiments of the present disclosure. MLC architecture 300 may be an example of the memory cell architecture in memory array 100 or 200 described with reference to FIGS. 1 and 2. MLC architecture 300 includes a word line 110-b, bit line 115-b, and memory cell 105-b, which may be examples of a word line 110, bit line 115, and memory cell 105 described with reference to FIGS. 1 and 2. Memory cell 105-b includes electrodes 205-b, 205-c, and 205-d and memory elements 220-a and 220-b, which may be examples of an electrode 205 and memory element 220 described with reference to FIG. 2. MLC architecture 300 also includes a bottom electrode 210-a and a selection component 215-a, which may be an example of a bottom electrode 210 and a selection component 215 described with reference to FIG. 2.

MLC architecture 300 may include memory element 220-a positioned between electrode 205-b and electrode 205-c and a second memory element, memory element 220-b, may be positioned between electrode 205-c and electrode 205-d. Memory elements 220-a and 220-b may be variable resistance materials, such as a chalcogenide material or a phase change material. The logic state of memory elements 220-a and 220-b may be based on whether each memory element 220-a and 220-b comprises an amorphous state or a crystalline state. In some cases, the entirety of memory element 220-a and the entirety of memory element 220-b may each be configured to one of an amorphous state or a crystalline state. As discussed previously, memory elements 220-a and 220-b may have a threshold voltage that depends on their amorphous state. The total threshold voltage of memory cell 105-b may be based on the sum of the threshold voltages of memory element 220-a, 220-b, and, in some cases, selection component 215-a. In some instances, the logic state of memory elements 220-a and 220-b may be based on melting memory elements 220-a and 220-b.

In some examples, the melting temperature of memory element 220-a may be different from the melting temperature of memory element 220-b. Electrodes 205-b, 205-c, and 205-d may each be the same material. In some cases, electrodes 205-b, 205-c, and 205-d may each have the same electrical resistance. That is, electrodes 205-b, 205-c, and 205-d may each have the same electrical resistivity and the same, or approximately the same, dimensions. Electrodes 205-b, 205-c, and 205-d may each comprise at least one of tungsten (W), titanium (Ti), carbon (C), tungsten nitride (WN), tungsten carbide (WC), tungsten silicide (WSi), tungsten silicon nitride (WSiN), tungsten carbon nitride (WCN), titanium silicon nitride (TiSiN), or any combination thereof.

The components of MLC architecture 300 may be stacked vertically as shown in FIG. 3 (e.g., stacked along the z-axis from the xy-plane of axes 225 of FIG. 2). In some examples, memory element 220-a may have a melting temperature that is less than memory element 220-b. This ordering may help enable multilevel programming, or it may be beneficial for heat dissipation such that neighboring components or memory cells 105 are largely or wholly unaffected. MLC architecture 300 may include more than two memory elements 220; for example, it may contain three memory elements 220 as shown in FIG. 5. More than three memory elements 220 are possible and may be included in some examples.

In some examples, MLC architecture 300 may include two conductive lines, for example, word line 110-b and bit line 115-b. Memory cell 105-b may be stacked between the two conductive lines, where electrode 205-d is adjacent to bit line 115-b and electrode 205-b adjacent word line 110-b. In other examples, bottom electrode 210-a and selection component 215-a may be positioned between electrode 205-b and word line 110-b, or they may be positioned between electrode 205-d and bit line 115-b. Selection component 215-a may be positioned elsewhere in the stack shown in FIG. 3. For example, selection component 215-a may be positioned between memory elements 220-a and 220-b. An example structure may include, from bottom to top, electrode 210-a, memory element 220-a, electrode 205-b, selection component 215-a, electrode 205-c, memory element 220-b, and electrode 205-d.

Selection component 215-a may be an electrically non-linear component (e.g., a non-ohmic component) such as a metal-insulator-metal (MIM) junction, an ovonic threshold switch (OTS), or a metal-semiconductor-metal (MSM) switch, among other types of two-terminal select device such as a diode. In some cases, selection component 215-a may be a chalcogenide film, for example, an alloy of selenium, arsenic, and germanium. The selection component may have a threshold voltage associated with its operation.

MLC architecture 300 may also include one or more lamina layers between components. A lamina layer may be a thin film (e.g., on the order of a few nanometers or less) formed between two components. The lamina layer may help form materials or components on another material and enhance coupling between various components. Although not shown in FIG. 3, lamina layers may exist at each interface between two components, for example, between an electrode 205 and a memory element 220. In some examples, the lamina layer may be tungsten.

Also illustrated in FIG. 3 is temperature plot 302. Temperature plot 302 includes position axis 305 and temperature axis 310. Position axis 305 is aligned with MLC architecture 300 such that a point on position axis 305 corresponds to the same point along MLC architecture 300. Temperature plot 302 includes temperature profiles 325 and 330, each of which may correspond to resulting temperature profiles due to different magnitudes of electrical current passing through MLC architecture 300. Temperature plot 302 also includes melting temperatures 315 and 320, where melting temperature 315 may be the melting temperature of memory element 220-a, and melting temperature 320 may be the melting temperature of memory element 220-b.

Applying a first current to memory cell 105-b may result in temperature profile 325. According to the example depicted in FIG. 3, at the position of memory element 220-*a*, the temperature is above the melting temperature of memory element 220-*a* (shown as melting temperature 315). At the position of memory element 220-*b*, the temperature is less than its melting temperature (shown as melting temperature 320). Thus, applying this first current may result in memory element 220-*a* melting without melting memory element 220-*b*.

Applying a second current to memory cell 105-*b* may result in temperature profile 330. As shown at their respective positions, the temperature is above the melting temperature for both memory elements 220-*a* and 220-*b*. Thus, applying the second current may result in melting both memory element 220-*a* and memory element 220-*b*.

By way of examples, based on MLC architecture 300 and temperature plot 302, three possible states may be stored in memory cell 105-*b*. For instance, applying the second current may melt both memory elements 220-*a* and 220-*b*. The current may be removed abruptly in order to quench, or lock in, the amorphous state of both memory elements 220-*a* and 220-*b*, representing a first stored state. This may have a highest threshold voltage as compared with threshold voltages of memory cell 105-*b* associated with other stored states. A second stored state may be possible by crystallizing the amorphous memory elements 220-*a* and 220-*b*, for example, by applying a third current to moderately heat both memory elements 220-*a* and 220-*b*. This may have the lowest relative threshold voltage. Applying the first current to melt memory element 220-*a* and not melt memory element 220-*b* may result in a third storable state. This current may be removed abruptly to quench the amorphous state of memory element 220-*a*, where memory element 220-*b* is in the crystalline state. This may have an intermediate threshold voltage. Thus, three possible configurations may be stored in memory cell 105-*b* and the logic state of memory cell 105-*b* may be based on the combination of the logic states of memory elements 220-*a* and 220-*b*. The electrical currents described above may be applied by a memory controller 140, for example, by applying a voltage to word line 110-*b* or digit line 115-*b*.

Each stored state of memory cell 105-*b* may have a threshold voltage associated with it that depends on the threshold voltages of the individual memory elements 220-*a* and 220-*b* and, in some cases, the selection component 215-*a*. For example, if memory elements 220-*a* and 220-*b* are in the crystalline state, they may not have a threshold voltage, and the threshold voltage of memory cell 105-*b* may be equal to the threshold voltage of selection component 215-*a*.

In general, the total threshold voltage of memory cell 105-*b* may be a sum of the threshold voltages associated with its components, such as memory elements 220-*a* and 220-*b* and selection component 215-*a*. To read memory cell 105-*b*, a voltage may be applied, for example, by using word line 110-*b* and bit line 115-*b*. A current may not flow unless the applied voltage is greater than the total threshold voltage of memory cell 105-*b*. Thus, the total threshold voltage of memory cell 105-*b* may be determined by applying a voltage and detecting a current, if any. For example, the applied voltage may be ramped to higher values until the threshold voltage is exceeded. Or, predetermined sense voltages may be applied one at a time, increasing in amplitude until the threshold is exceeded.

In some cases, the sense voltages may be based on the threshold voltages of selection component 215-*a* or memory elements 220-*a* and 220-*b*. For example, the first sense voltage may be greater than the threshold voltage of selection component 215-*a*, and a second sense voltage may be greater than the sum of the threshold voltage of selection component 215-*a* and memory element 220-*a*, and so forth.

FIG. 4 illustrates an example multilevel memory cell architecture 400 and temperature plot 402 that supports multilevel cell programming in accordance with various embodiments of the present disclosure. MLC architecture 400 may be an example of the memory cell architecture in memory array 100, 200, or 300 described with reference to FIGS. 1-3. MLC architecture 400 includes a word line 110-*c*, a bit line 115-*c*, and a memory cell 105-*c*, which may be examples of a word line 110, bit line 115, and memory cell 105 described with reference to FIGS. 1-3. Memory cell 105-*c* includes electrodes 205-*e*, 205-*f*, and 205-*g* and memory elements 220-*c* and 220-*d*, which may be examples of an electrode 205 and memory element 220, described with reference to FIGS. 2 and 3. MLC architecture 400 also includes a bottom electrode 210-*b* and a selection component 215-*b*, which may be an example of a bottom electrode 210 and a selection component 215 described with reference to FIGS. 2 and 3.

MLC architecture 400 may include memory element 220-*c* positioned between electrode 205-*e* and electrode 205-*f* and a second memory element, memory element 220-*d*, may be positioned between electrode 205-*f* and electrode 205-*g*. Memory elements 220-*c* and 220-*d* may be variable resistance materials, such as a chalcogenide material or a phase change material. Electrodes 205-*e*, 205-*f*, and 205-*g* may each comprise at least one of tungsten, titanium, carbon, tungsten nitride, tungsten carbide, tungsten silicide, tungsten silicon nitride, tungsten carbon nitride, titanium silicon nitride, or any combination thereof. The logic state of memory elements 220-*c* and 220-*d* may be based on whether each memory element 220-*c* and 220-*d* comprises an amorphous state or a crystalline state, and memory element 220-*c* and 220-*d* may have a threshold voltage based on their crystalline state. In some cases, the entirety of memory element 220-*c* and the entirety of memory element 220-*d* may each be configured to one of an amorphous state or a crystalline state. The total threshold voltage of memory cell 105-*c* may be based on the sum of the threshold voltages of memory element 220-*c*, 220-*d*, and selection component 215-*b*. In some instances, the logic state of memory elements 220-*c* and 220-*d* may be based on melting memory elements 220-*c* and 220-*d*.

Memory elements 220-*c* and 220-*d* may have the same melting temperature and electrodes 205-*e*, 205-*f*, and 205-*g* may each have different electrical resistances. Electrical resistance may be a function of electrical resistivity, an intrinsic material property, and the electrode dimensions. Thus, different resistances may be achieved based on the electrode's resistivity or its dimensions (such as the electrode thickness), or both. The resistivity may be controlled by varying the properties of the electrode material. For example, an alloy consisting of two or more elements may be used, where the proportion of the two elements may be varied to control the resistivity. Or the formation parameters of an elemental material may be modified to vary the electrical resistivity.

The components of MLC architecture 400 may be stacked vertically as shown in FIG. 4. In some examples, the electrical resistance of electrode 205-*e* may be greater than or equal to that of electrode 205-*f*, and the electrical resistance of electrode 205-*f* may be greater than or equal to that of electrode 205-*g*. This ordering may help enable multilevel programming or may be beneficial for heat dissipation such that neighboring components or memory cells 105 are less affected while heating memory cell 105-c. MLC architecture 400 may include more than two memory elements 220, for example, it may contain three memory elements 220 as shown in FIG. 5. More than three memory elements 220 are possible.

The components of MLC architecture 400 may be arranged in other configurations. In some cases, the electrode resistances may be ordered differently than described above. For example, the electrical resistance of electrode 205-f may be less than that of electrode 205-e and electrode 205-g. That is, electrode 205-f may have the lowest resistance among electrodes 205-e, 205-f, and 205-g. Other configurations may be possible. In general, the electrical resistance of each electrode may be different and may be set relative to the other electrodes in order to optimize operation of memory cell 105-c.

In some examples, MLC architecture 400 may include two conductive lines, for example, word line 110-c and bit line 115-c. Memory cell 105-c may be stacked between the two conductive lines, where electrode 205-g is adjacent to bit line 115-c and electrode 205-e adjacent word line 110-c. In other examples, bottom electrode 210-b and selection component 215-b may be positioned between electrode 205-e and word line 110-c, or they may be positioned between electrode 205-g and bit line 115-c. Selection component 215-b may be positioned elsewhere in the stack shown in FIG. 4. For example, selection component 215-b may be positioned between memory elements 220-c and 220-d. An example structure may include, from bottom to top, electrode 210-b, memory element 220-c, electrode 205-e, selection component 215-b, electrode 205-f, memory element 220-d, and electrode 205-g.

Selection component 215-b may be an electrically non-linear component (e.g., a non-ohmic component) such as a metal-insulator-metal (MIM) junction, an ovonic threshold switch (OTS), or a metal-semiconductor-metal (MSM) switch, among other types of two-terminal select device such as a diode. In some cases, selection component 215-b may be a chalcogenide film, for example, an alloy of selenium, arsenic, and germanium.

MLC architecture 400 may also include one or more lamina layers between components. As discussed above, a lamina layer may be a thin film (e.g., on the order of a few nanometers) formed between two components and may help in forming materials or components on another material. Although not shown in FIG. 4, lamina layers may exist at each interface between two components, for example, between an electrode 205 and a memory element 220. In some examples, the lamina layer may be tungsten.

Also illustrated in FIG. 4 is temperature plot 402. Temperature plot 402 includes position axis 405 and temperature axis 410. Position axis 405 is aligned with MLC architecture 400 such that a point on position axis 405 corresponds to the same point along MLC architecture 400. Temperature plot 402 includes temperature profiles 425 and 430, each of which may correspond to different magnitudes of electrical current passing through MLC architecture 400. Temperature plot 402 also includes melting temperature 415, which may be the melting temperature of memory elements 220-c and 220-d.

Temperature plot 402 may result for memory cell 105-c where the electrical resistance of electrode 205-e is greater than that of electrode 205-f, and the electrical resistance of electrode 205-f is greater than that of electrode 205-g. Other profiles may be possible by varying the relative electrical resistances of the electrodes. As shown in temperature plot 402, applying a first current to memory cell 105-c may result in temperature profile 425. At the position of memory element 220-c, the temperature is above the melting temperature of memory element 220-c (shown as melting temperature 415), and the temperature is less than melting temperature 415 at the position of memory element 220-d. Thus, applying this first current may result in melting memory element 220-c without melting memory element 220-d.

Applying a second current to memory cell 105-c may result in temperature profile 430. As shown at their respective positions, the temperature is above melting temperature 415 for both memory elements 220-c and 220-d. Thus, applying the second current may result in melting both memory element 220-c and memory element 220-d.

Based on MLC architecture 400 and temperature plot 402, three possible states may be stored in memory cell 105-c. For example, applying the second current may melt both memory elements 220-c and 220-d. The current may be removed abruptly in order to quench the amorphous state of both memory elements 220-c and 220-d, representing a first stored state. This may have a highest total threshold voltage. A second stored state may be possible by crystallizing the amorphous memory elements 220-c and 220-d, for example, by applying a third current to moderately heat both memory elements 220-c and 220-d. This may have a lowest total threshold voltage. Applying the first current to melt memory element 220-c and not melt memory element 220-d may result in a third storable state. The first current may be removed abruptly to quench the amorphous state of memory element 220-c, where memory element 220-d is in the crystalline state. This may have an intermediate total threshold voltage. Thus, three possible configurations may be stored in memory cell 105-c, and the logic state of memory cell 105-c may be based on a combination of the logic states of memory elements 220-c and 220-d. More configurations are possible for the case of more than two memory elements. The electrical currents described above may be applied by a memory controller 140, for example, by applying a voltage to word line 110-c or digit line 115-c.

Each stored state of memory cell 105-c may have a threshold voltage associated with it that depends on the threshold voltages of the individual memory elements 220-c and 220-d and, in some cases, the selection component 215-b. For example, if memory elements 220-c and 220-d are in the crystalline state, they may not have a threshold voltage, and the threshold voltage of memory cell 105-c may be equal to the threshold voltage of selection component 215-b.

In general, the total threshold voltage of memory cell 105-c may be a sum of the threshold voltages associated with its components, such as memory elements 220-c and 220-d and selection component 215-b. To read memory cell 105-c, a voltage may be applied, for example, by using word line 110-c and bit line 115-c. A current may not flow unless the applied voltage is greater than the total threshold voltage of memory cell 105-c. Thus, the total threshold voltage of memory cell 105-c may be determined by applying a voltage and detecting a current, if any. For example, the applied voltage may be ramped to higher values until the threshold voltage is exceeded. Or, predetermined sense voltages may be applied one at a time, increasing in amplitude until the threshold is exceeded.

In some cases, the sense voltages may be based on the threshold voltages of selection component 215-b or memory elements 220-c and 220-d. For example, the first sense voltage may be greater than the threshold voltage of selection component 215-b, and a second sense voltage may be greater than the sum of the threshold voltage of selection component 215-b and memory element 220-c, and so forth.

FIG. 5 illustrates an example multilevel memory cell architecture 500 that supports multilevel cell programming in accordance with various embodiments of the present disclosure. MLC architecture 500 may be an example of the memory cell architecture in memory array 100 or 200 or architecture 300, or 400 described with reference to FIGS. 1-4. MLC architecture 500 includes a word line 110-d, a bit line 115-d, and a memory cell 105-d, which may be examples of a word line 110, bit line 115, and memory cell 105 described with reference to FIGS. 1-4. Memory cell 105-d includes electrodes 205-h, 205-i, 205-j, and 205-k and memory elements 220-e, 220-f, and 220-g, which may be examples of an electrode 205 and memory element 220 described with reference to FIGS. 2-4. MLC architecture 500 also includes a bottom electrode 210-c and a selection component 215-c, which may be an example of a bottom electrode 210 and a selection component 215 described with reference to FIGS. 2-4.

MLC architecture 500 may include memory element 220-e positioned between electrode 205-h and electrode 205-i, memory element 220-f positioned between electrodes 205-i and 205-j, and memory element 220-g positioned between electrodes 205-j and 205-k. Memory elements 220-e, 220-f, and 220-g may be variable resistance materials, such as a chalcogenide material or a phase change material. Electrodes 205-h, 205-i, 205-j, and 205-k may each comprise at least one of tungsten, titanium, carbon, tungsten nitride, tungsten carbide, tungsten silicide, tungsten silicon nitride, tungsten carbon nitride, titanium silicon nitride, or any combination thereof. In some cases, the components of MLC architecture 500 may stacked vertically as shown in FIG. 5.

The logic state of memory elements 220-e, 220-f, and 220-g may be based on whether each memory element 220-e, 220-f, and 220-g comprises an amorphous state or a crystalline state. In some cases, the entirety of each memory element 220-e, 220-f, and 220-g may be configured to one of an amorphous state or a crystalline state. The logic state of memory cell 105-d may be based on the combination of logic states of memory elements 220-e, 220-f, and 220-g. As discussed above, a threshold voltage of each memory element 220-e, 220-f, and 220-g may be based on their respective amorphous states.

In some examples, memory elements 220-e, 220-f, and 220-g may have the same melting temperature and electrodes 205-h, 205-i, 205-j, and 205-k may each have different electrical resistances, which may be controlled as discussed in FIG. 4. Electrodes 205-h, 205-i, 205-j, and 205-k may be ordered in the stack such that the electrical resistance of electrode 205-h is greater than the resistance of electrode 205-i which is greater than the electrical resistance of electrode 205-j which is greater than the resistance of electrode 205-k. In other words, the electrical resistance of the electrodes decreases as one moves up the vertical stack. Other configurations are possible. For example, the electrical resistance of the electrodes may be ordered differently as discussed in FIG. 4.

In another example, the melting temperature of memory elements 220-e, 220-f, and 220-g may each be different from one another, and electrodes 205-h, 205-i, 205-j, and 205-k may each be the same material. In some cases, electrodes 205-h, 205-i, 205-j, and 205-k may each have the same electrical resistance. Memory elements 220-e, 200-f, and 220-g may be ordered in the stack such that the melting temperature of memory element 220-e is less than memory element 220-f which is less than the melting temperature of memory element 220-g.

The various memory elements 220 and electrodes 205 in memory cell 105-d may also be mixed. For example, memory elements 220-e, 220-f, and 220-g may have different melting temperatures, and electrodes 205-h, 205-i, 205-j, and 205-k may each have different electrical resistances. Additionally, more than three memory elements 220 may be used, where each memory element 220 may be separated by an electrode 205.

In some examples, MLC architecture 500 may include two conductive lines, for example, word line 110-d and bit line 115-d. Memory cell 105-d may be stacked between the two conductive lines, where electrode 205-k is adjacent to bit line 115-d and electrode 205-h adjacent word line 110-d. In other examples, bottom electrode 210-c and selection component 215-c may be positioned between electrode 205-h and word line 110-d or between electrode 205-k and bit line 115-d. Or, as mentioned in FIGS. 3 and 4, selection component 215-c may be positioned between any two memory elements 220.

MLC architecture 500 may also include one or more lamina layers between components. Although not shown in FIG. 5, lamina layers may exist at each interface between two components, for example, between an electrode 205 and a memory element 220. In some examples, the lamina layer may be tungsten.

Figure 6A:
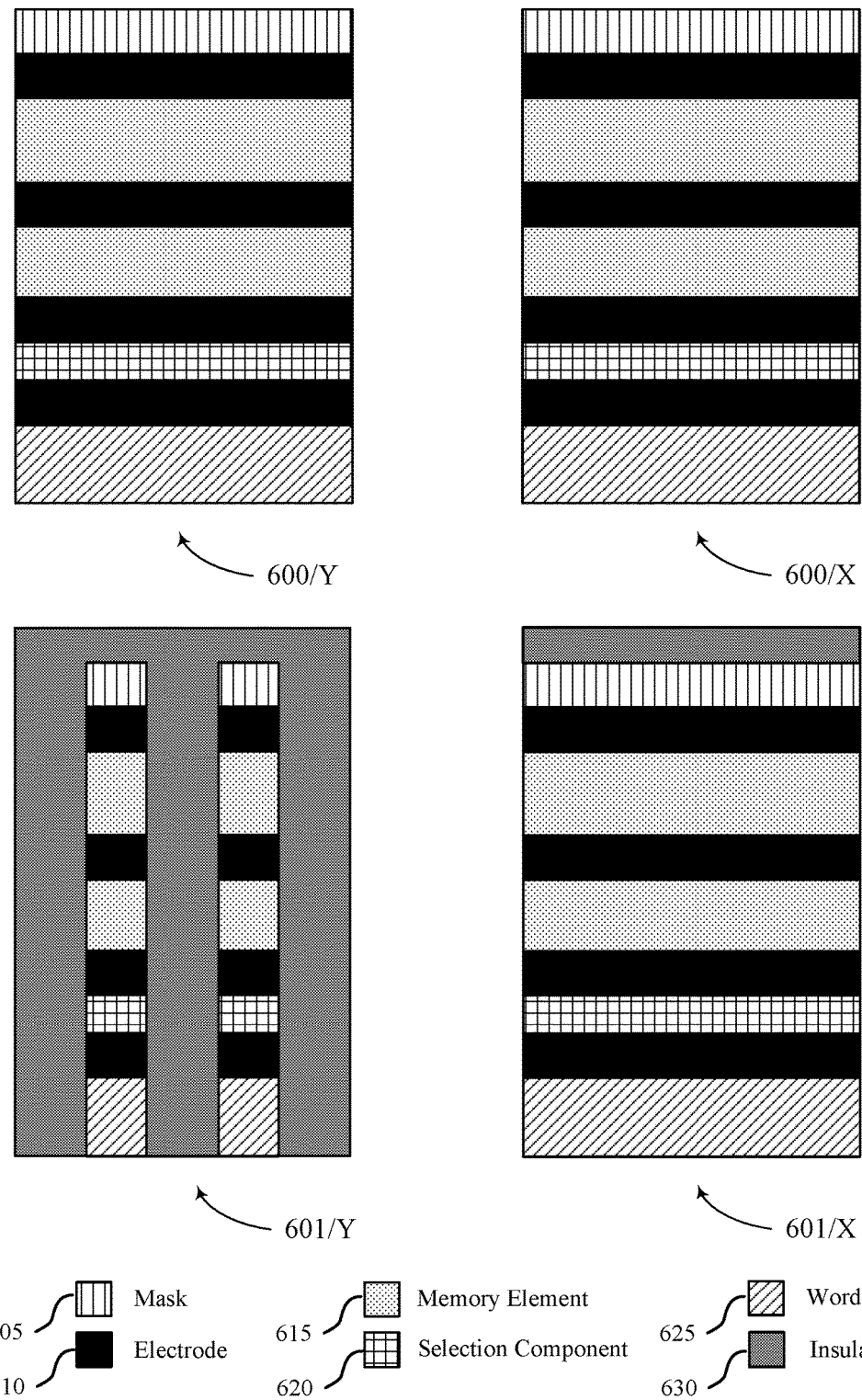
FIGS. 6A-6C illustrate an example process flow for forming a memory array for multilevel cell programming in accordance with various embodiments of the present disclosure.
Figure 6B:
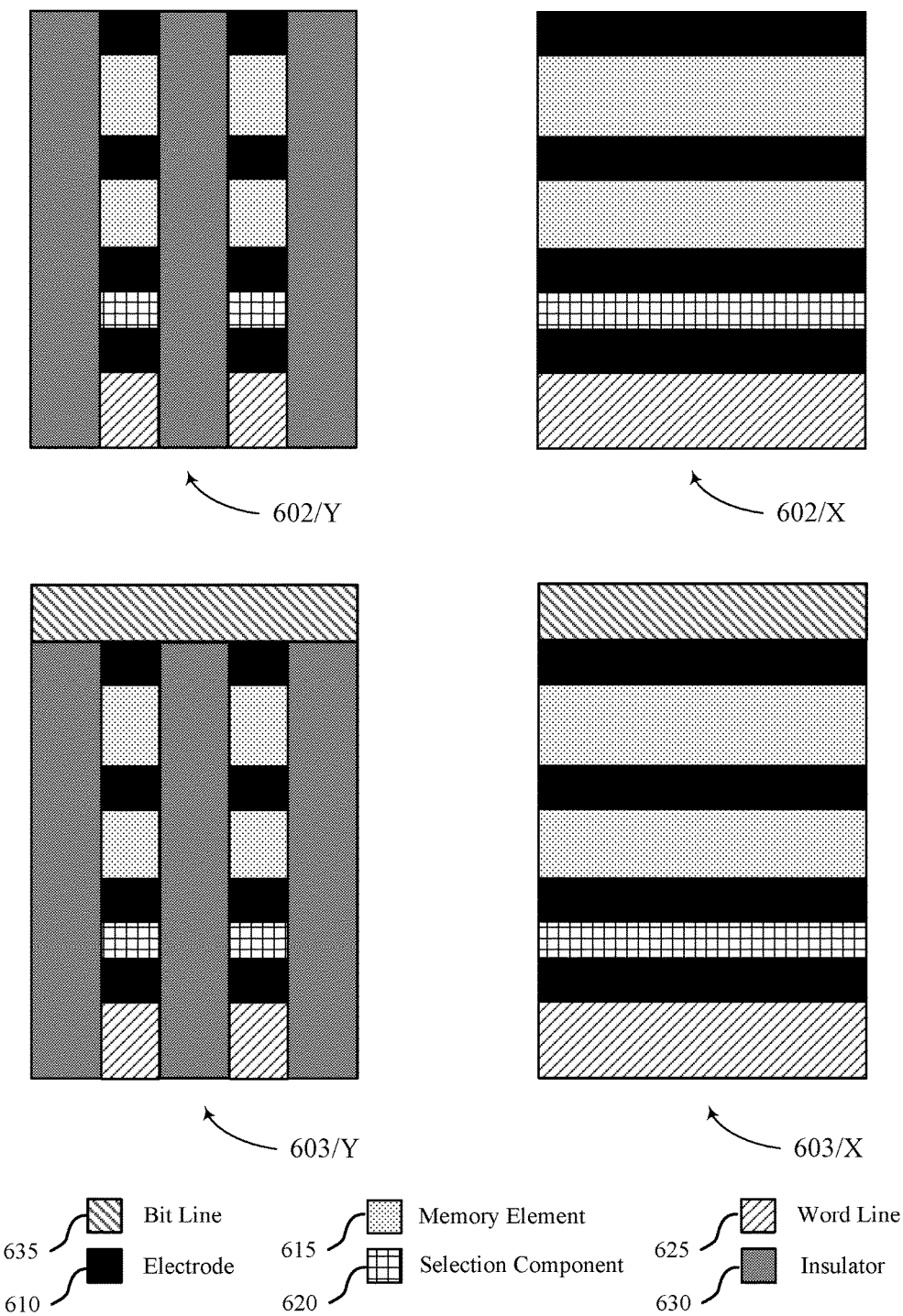
Figure 6C:
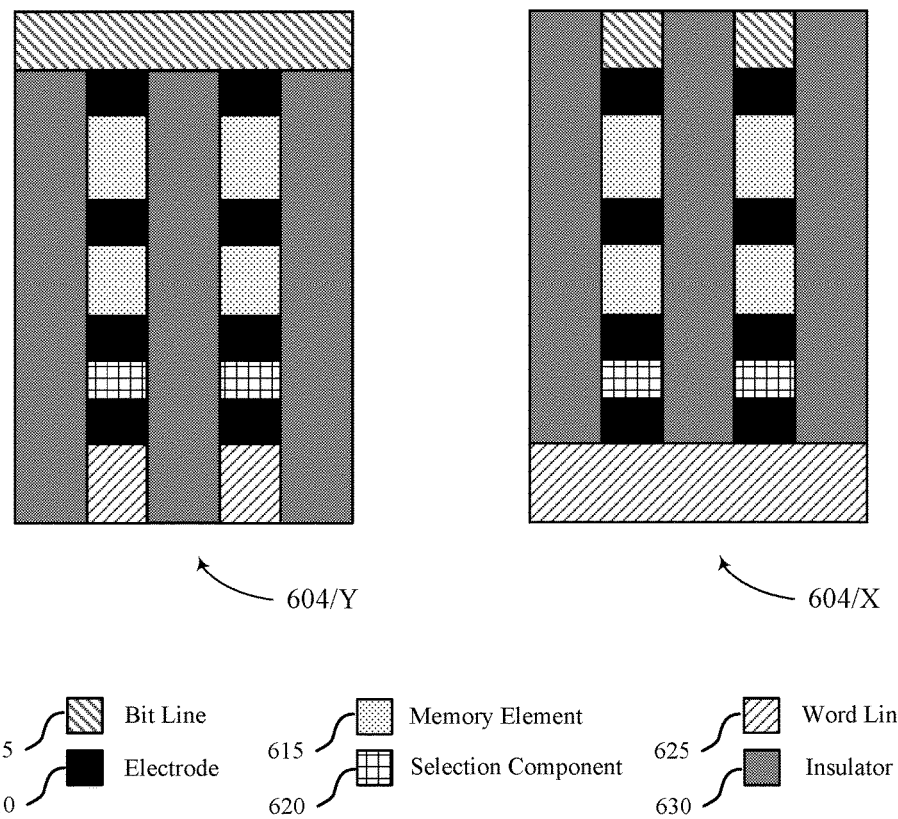

FIGS. 6A, 6B, and 6C illustrate an example process flow for forming a memory cell array for multilevel cell programming, which may include processing steps 600, 601, 602, 603, and 604 in accordance with various embodiments of the present disclosure. The resulting MLC architecture may be an example of the memory cell architecture in memory array 100 or 200 or architecture 300 or 400, or 500 described with reference to FIGS. 1-5. Processing steps 600, 601, 602, 603, and 604 include formation of electrode materials 610, memory element materials 615, selection component material 620, word line material 625, and bit line material 635, which may, after processing, be examples of electrode 205, memory element 220, selection component 215, word line 110, and bit line 115 with reference to FIGS. 1-5. Processing steps 600-604 also include formation of a mask material 605 and insulator 630. Each processing step 600-604 is labeled with "/Y" or "/X" following the number, e.g., 600/Y and 600/X. The labels /Y and /X correspond to the axis from which the memory array is viewed, where the direction (X or Y) corresponds to the x-axis or y-axis of a 3D field, such as axes 225 depicted in FIG. 2. Thus, 600/Y and 600/X refer to the same processing step 600 but illustrate two different, orthogonal views.

At processing step 600, a stack of materials may be formed by depositing material on a substrate, for example, by depositing layers of material. The stack may comprise a plurality of conductive materials, where each conductive material of the plurality is separated from another conductive material by a memory element material. The stack may include at least two memory element materials. For example, processing step 600 may include forming word line material 625, forming a first electrode material 610, forming a selection component material 620, forming a second electrode material 610, forming a memory element material 615, forming a third electrode material 610, forming a second memory element material 615, forming a fourth electrode material 610, and forming a mask material 605.

In general, electrode materials 610 may be the same or different materials or may have the same or different electrical resistances, and may each comprise at least one of tungsten, titanium, carbon, tungsten nitride, titanium silicon nitride, or any combination thereof. Other conducting materials are possible. Likewise, memory element materials 615 may be the same or different materials and may be variable resistance materials, such as a chalcogenide material or a phase change material. In some cases, memory element materials 615 may be materials with the same or different melting temperatures. Furthermore, the number of electrode materials 610 and memory element materials 615 need not be limited to that shown in FIG. 6A. For example, three memory element materials 615 may be formed and each memory element material 615 may be separated by an electrode material 610. Additionally, lamina materials, such as thin tungsten layers, may be formed between any two materials.

At processing step 601, material may be removed to form at least one channel in the stack. Multiple channels may be formed as well. In some cases, mask 605 may be patterned to define the channel, where subsequent etching selectively removes material where no mask is present. In some examples, mask 605 may be a silicon nitride (SiN) hard mask and may be patterned using a photolithography process. Other mask materials are possible. Material may be removed by etching, such as chemical or plasma etching. Processing step 601 may include more than one material removal steps. For example, a first removal may penetrate to the top of the selection component material 620. The channel may be sealed with a liner and then another material removal step may be performed to continue the channel through to the word line material 625. By protecting the memory element materials 615 before etching the selection component material 620, cross-contamination between memory element materials 615 and selection component material 620 may be prevented. The channel may be formed in the word line direction, for example, along the y-direction (or y-axis) as seen by comparing 601/Y and 601/X. After forming the channel, it may be filled with insulator 630.

At processing step 602, material may be removed to expose the top electrode material 610. The removed material may include insulator 630 and mask 605. This may be performed by planarization, such as chemical-mechanical planarization.

At processing step 603, bit line material 635 may be formed on top of the stack. For example, a conducting material may be deposited by various deposition techniques. The bit line material 635 may be coupled to the top electrode material 610.

At processing step 604, material may be removed to form a second channel, where the second channel is in a direction substantially perpendicular to the first channel formed in processing step 601. The resulting structure may be pillars, as seen by comparing 604/Y and 604/X. Material may be removed down to the top of word line material 625. As in processing step 601, material may be removed in multiple steps to prevent cross-contamination. For example, a first removal may penetrate to the top of the selection component material 620. The channel may be sealed with a liner and then another material removal step may be performed to continue the channel through to the top of word line material 625. After forming the channel, it may be filled with insulator 630.

Figure 7:
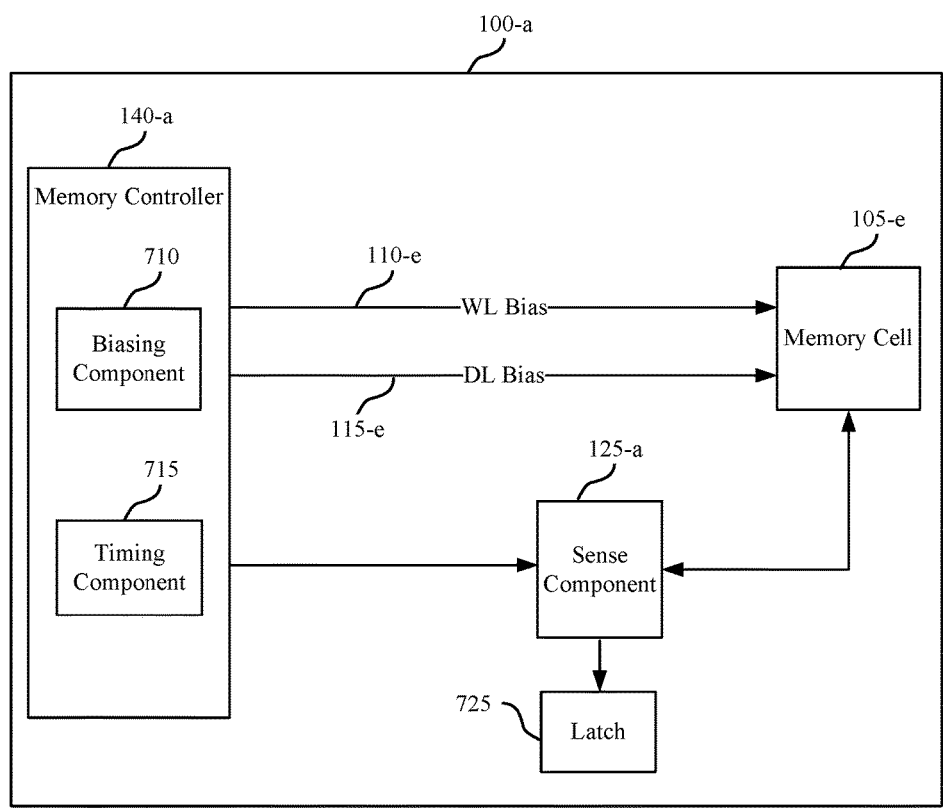
FIG. 7 illustrates a memory array that supports multilevel memory cell architecture and programming in accordance with various embodiments of the present disclosure.

FIG. 7 shows a block diagram 700 of a memory array 100-a that supports multilevel memory cell architecture and programming in accordance with various embodiments of the present disclosure. Memory array 100-a may be referred to as an electronic memory apparatus and may include memory controller 140-a and memory cell 105-e, which may be examples of memory controller 140 and memory cell 105 described with reference to FIGS. 1-5. Memory controller 140-a may include biasing component 710 and timing component 715 and may operate memory array 100-a as described in FIGS. 1-5. Memory controller 140-a may be in electronic communication with word line 110-e, bit line 115-e, and sense component 125-a, which may be examples of word line 110, bit line 115, and sense component 125, described with reference to FIGS. 1-5. Memory array 100-a may also include latch 725. The components of memory array 100-a may be in electronic communication with one another and may perform the functions described with reference to FIGS. 1-5. In some cases, sense component 125-a and latch 725 may be components of memory controller 140-a.

Memory controller 140-a may be configured to activate word line 110-e or bit line 115-e by applying voltages or currents to those various nodes. For example, biasing component 710 may be configured to apply a voltage to operate memory cell 105-e to read or write memory cell 105-e as described above. The applied voltage may be based on a desired current to be applied as well as the resistance of memory cell 105-e and any electrodes. In some examples, memory cell 105-e may contain more than one memory element, and memory controller 140-a may apply a first current to memory cell 105-e, where a magnitude of the first current is based at least in part on a melting temperature of the first memory element, and where the melting temperature of the first memory element is less than a melting temperature of the second memory element. Memory controller 140-a may also apply a second current to memory cell 105-e, where a magnitude of the second current is based at least in part on the melting temperature of the second memory element. Memory controller 140-a may also apply various sense voltages to memory cell 105-e in order to determine the total threshold voltage of memory cell 105-e. For example, it may apply voltages to memory cell 105-e until a current flow through memory cell 105-e is detected. In some cases, memory controller 140-a may include a row decoder, column decoder, or both, as described with reference to FIG. 1. This may enable memory controller 140-a to access one or more memory cells 105-e. Biasing component 710 may also provide voltages to operate sense component 125-a.

In some cases, memory controller 140-a may perform its operations using timing component 715. For example, timing component 715 may control the timing of the various word line or bit line selections, including timing for switching and voltage application to perform the memory functions, such as reading and writing, discussed herein. In some cases, timing component 715 may control the operations of biasing component 710.

Sense component 125-a may include voltage or current sense amplifiers to determine the stored logic state in memory cell 105-e, where the logic state may be based on a combination of the logic states of the memory elements within memory cell 105-e, as discussed above. Upon determining the logic state, sense component 125-a may then store the output in latch 725, where it may be used in accordance with the operations of an electronic device using memory array 100-a.

Figure 8:
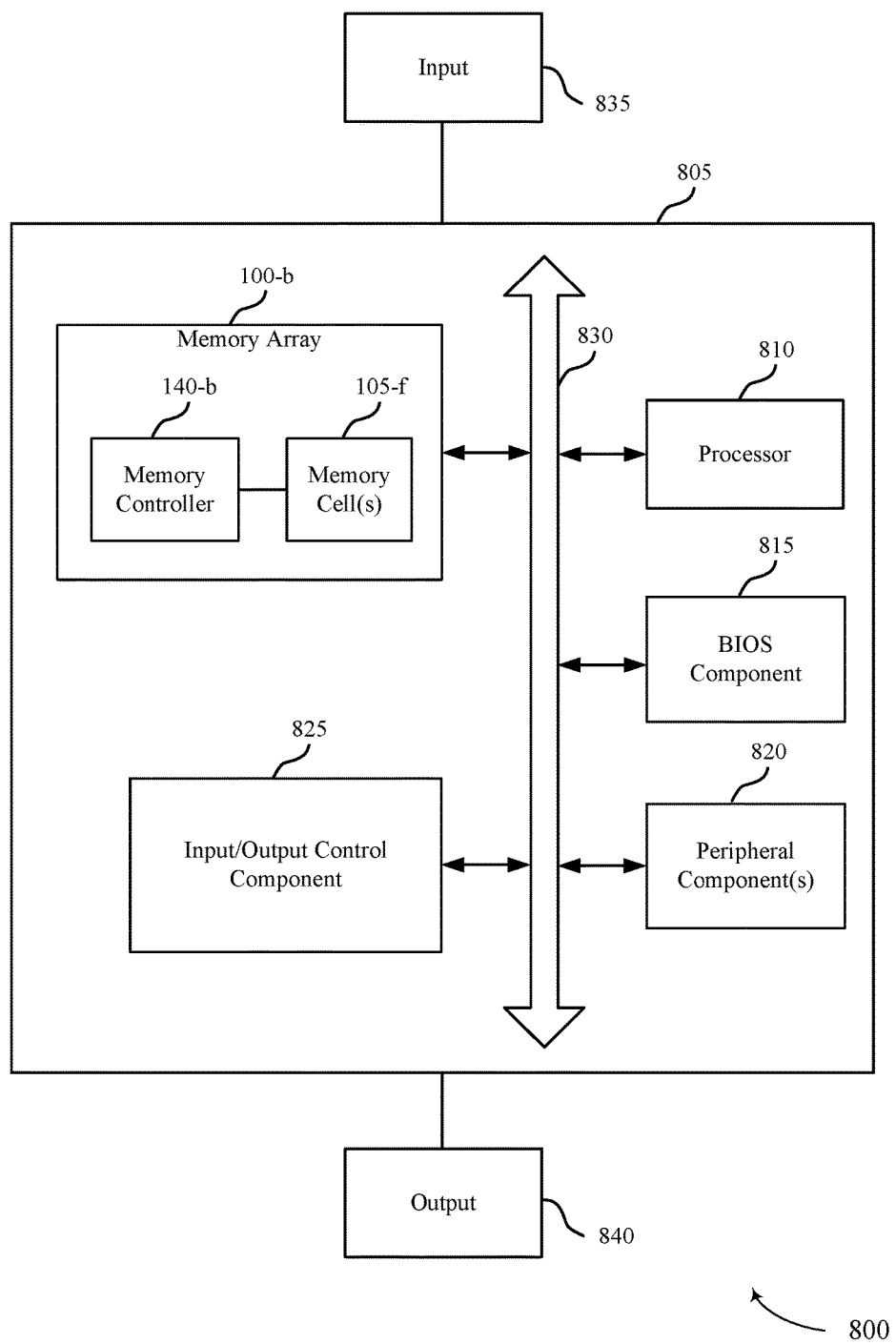
FIG. 8 illustrates a system, including a memory array, that supports multilevel memory cell architecture and programming in accordance with various embodiments of the present disclosure.

FIG. 8 shows a diagram of a system 800 that supports multilevel memory cell architecture and programming in accordance with various embodiments of the present disclosure. System 800 may include a device 805, which may be or include a printed circuit board to connect or physically support various components. Device 805 may include a memory array 100-b, which may be an example of memory array 100 described in FIG. 1 and FIG. 7. Memory array 100-b may contain memory controller 140-b and memory cell(s) 105-f, which may be examples of memory controller 140 described with reference to FIGS. 1 and 7 and memory cells 105 described with reference to FIGS. 1-5 and 7. Device 805 may also include a processor 810, BIOS component 815, peripheral component(s) 820, and input/output control component 825. The components of device 805 may be in electronic communication with one another through bus 830.

Processor 810 may be configured to operate memory array 100-b through memory controller 140-b. In some cases, processor 810 performs the functions of memory controller 140 described with reference to FIGS. 1 and 7. In other cases, memory controller 140-b may be integrated into processor 810. Processor 810 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 810 may perform various functions described herein, including applying various current magnitudes to memory cell 105-f to read or write the multilevel cell. Processor 810 may, for example, be configured to execute computer-readable instructions stored in memory array 100-b to cause device 805 perform various functions or tasks.

BIOS component 815 may be a software component that includes a basic input/output system (BIOS) operated as firmware, which may initialize and run various hardware components of system 800. BIOS component 815 may also manage data flow between processor 810 and the various components, e.g., peripheral components 820, input/output control component 825, etc. BIOS component 815 may include a program or software stored in read-only memory (ROM), flash memory, or any other non-volatile memory.

Peripheral component(s) 820 may be any input or output device, or an interface for such devices, that is integrated into device 805. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output controller component 825 may manage data communication between processor 810 and peripheral component(s) 820, input 835, or output 840. Input/output controller component 825 may also manage peripherals not integrated into device 805. In some cases, input/output controller component 825 may represent a physical connection or port to the external peripheral.

Input 835 may represent a device or signal external to device 805 that provides input to device 805 or its components. This may include a user interface or interface with or between other devices. In some cases, input 835 may be a peripheral that interfaces with device 805 via peripheral component(s) 820 or may be managed by input/output controller component 825.

Output 840 may represent a device or signal external to device 805 configured to receive output from device 805 or any of its components. Examples of output 840 may include data or signals used by a display, audio speakers, a printing device, another processor or printed circuit board, etc. In some cases, output 840 may be a peripheral that interfaces with device 805 via peripheral component(s) 820 or may be managed by input/output controller component 825.

The components of memory controller 140-b, device 805, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 9:
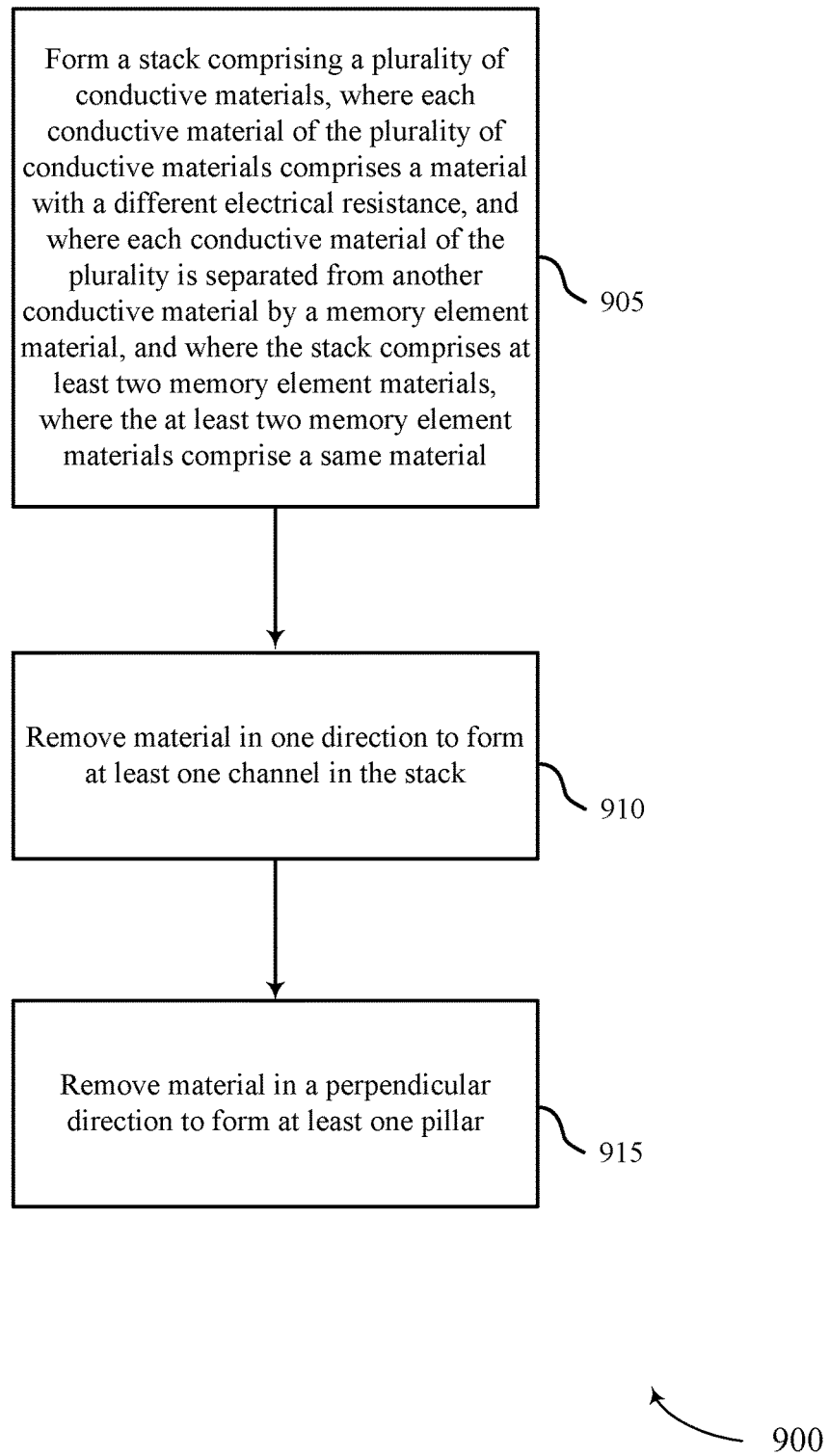
FIGS. 9-10 are flowcharts that illustrate a method or methods for forming a memory cell architecture for multilevel cell programming in accordance with various embodiments of the present disclosure.

FIG. 9 shows a flowchart illustrating a method 900 to form a multilevel memory cell architecture for multilevel cell programming in accordance with various embodiments of the present disclosure. The formation methods may include those described with reference to FIGS. 2-6. For example, materials or components may be formed through various combinations of material deposition and removal. In some cases, material formation or removal may include one or more photolithography steps not denoted explicitly.

At block 905, the method may include forming a stack comprising a plurality of conductive materials, where each conductive material of the plurality of conductive materials is a material with a different electrical resistance, and where each conductive material of the plurality is separated from another conductive material by a memory element material, and where the stack comprises at least two memory element materials, where the at least two memory element materials comprise a same material, as described with reference to FIG. 6.

At block 910, the method may include a first removing of material to form at least one channel in the stack, as described with reference to FIG. 6.

At block 915, the method may include a second removing of material in a direction perpendicular to the first removing to form at least one pillar, as described with reference to FIG. 6.

In some examples, the method may also include forming a first conductive line material, forming a second conductive line material, and forming a selection component material, where the selection component material and the stack are positioned between the first conductive line material and the second conductive line material, where the first conductive line material, the second conductive line material, and the selection component material are formed before the first removing of material.

Figure 10:
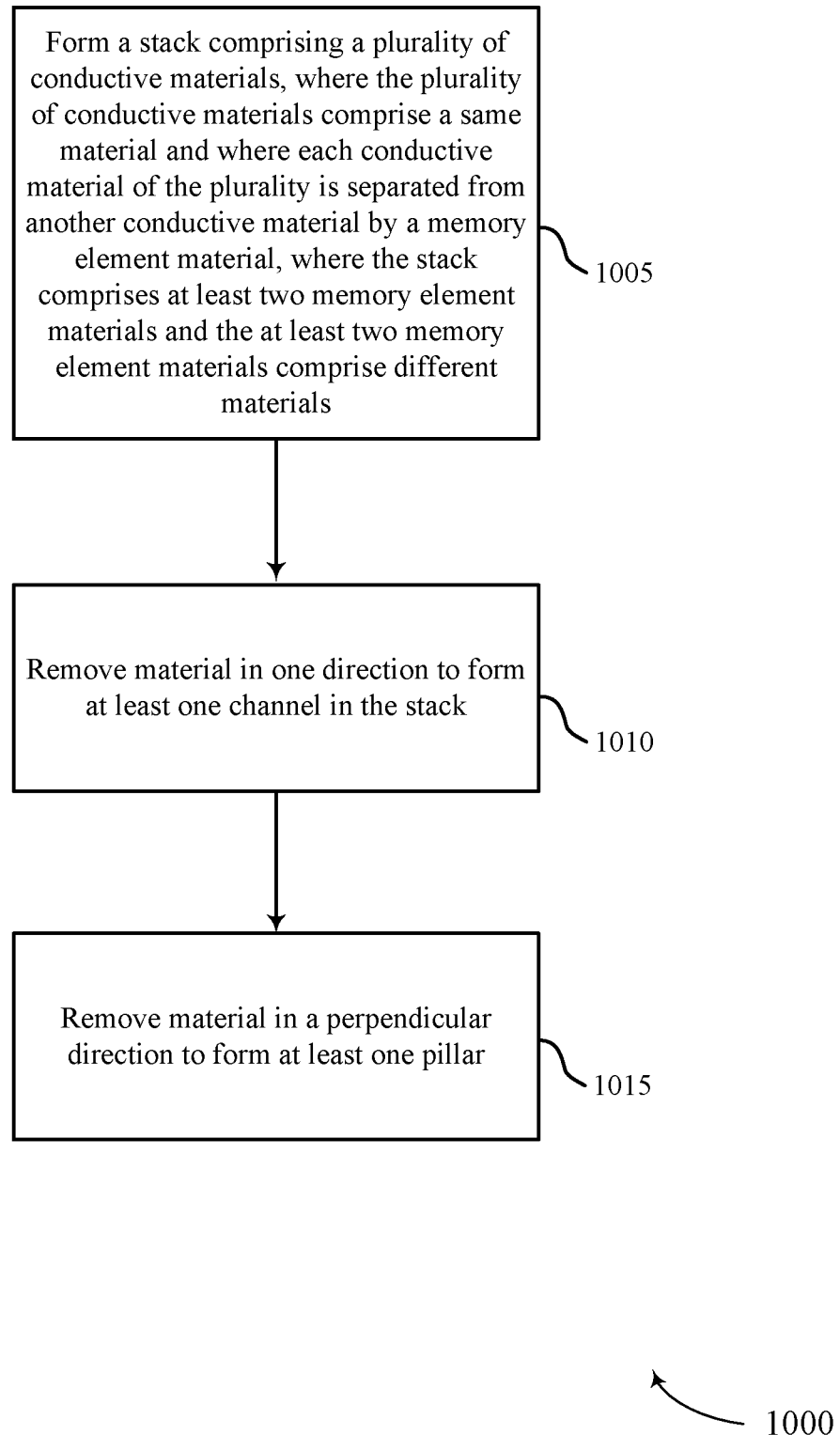

FIG. 10 shows a flowchart illustrating a method 1000 to form a multilevel memory cell architecture for multilevel cell programming in accordance with various embodiments of the present disclosure. The formation methods may include those described with reference to FIGS. 2-6. For example, materials or components may be formed through various combinations of material deposition and removal. In some cases, material formation or removal may include one or more photolithography steps not denoted explicitly.

At block 1005, the method may include forming a stack comprising a plurality of conductive materials, where the plurality of conductive materials are a same material and where each conductive material of the plurality is separated from another conductive material by a memory element material, where the stack comprises at least two memory element materials and the at least two memory element materials comprise different materials, as described with reference to FIG. 6.

At block 1010, the method may include a first removing of material to form at least one channel in the stack, as described with reference to FIG. 6.

At block 1015, the method may include a second removing of material in a direction perpendicular to the first removing to form at least one pillar, as described with reference to FIG. 6.

In some examples, the method may also include forming a first conductive line material, forming a second conductive line material, and forming a selection component material, where the selection component material and the stack are positioned between the first conductive line material and the second conductive line material, where the first conductive line material, the second conductive line material, and the selection component material are formed before the first removing of material.

Figure 11:
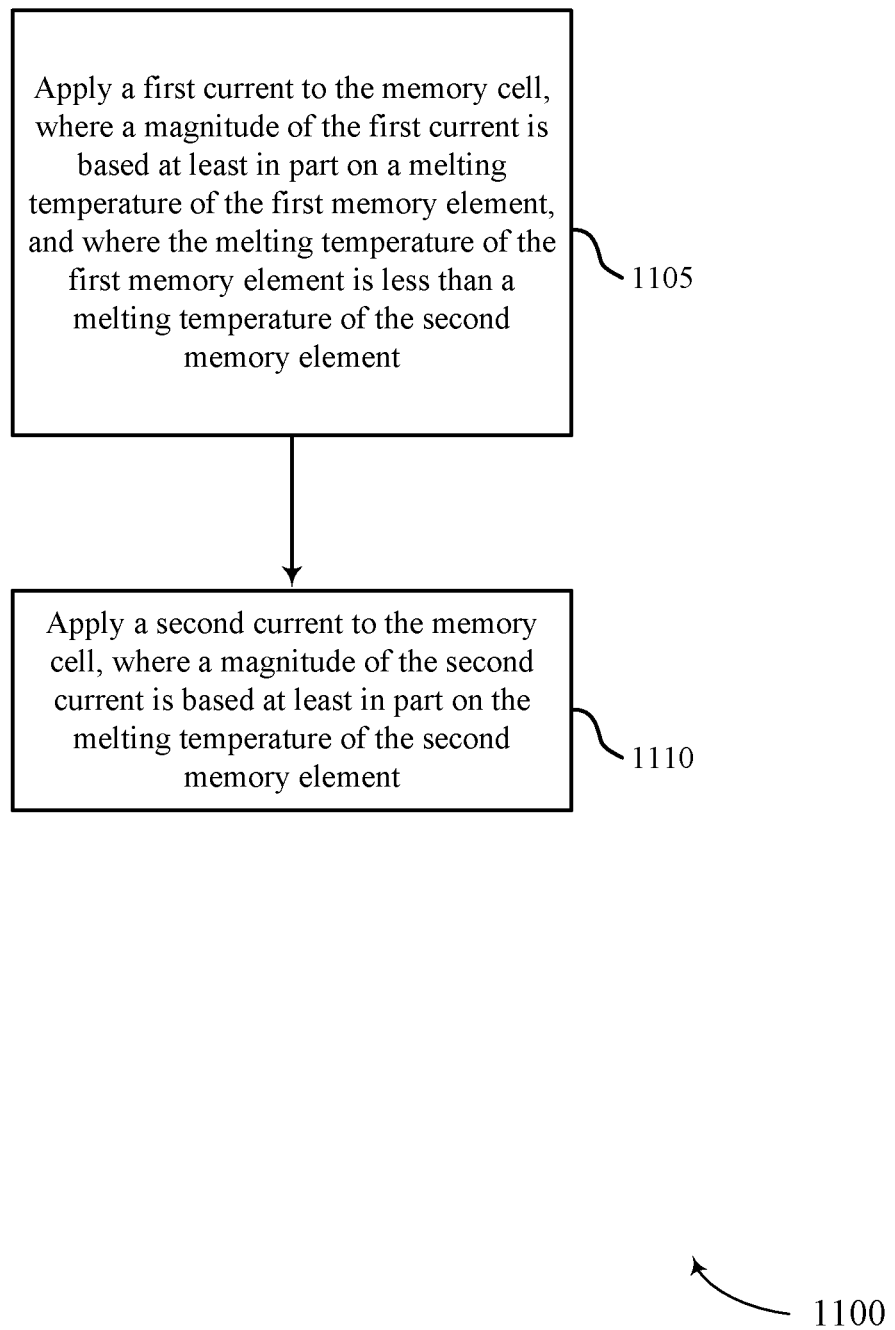
FIG. 11 is a flowchart that illustrates a method for programming a multilevel memory cell in accordance with various embodiments of the present disclosure.

FIG. 11 shows a flowchart illustrating a method 1100 for programming a multilevel memory cell in accordance with various embodiments of the present disclosure. The operations of method 1100 may be implemented by a memory array 100 as described with reference to FIGS. 1-5. For example, the operations of method 1100 may be performed by a memory controller 140 as described with reference to FIGS. 1, 7, and 8. In some examples, a memory controller 140 may execute a set of codes to control the functional elements of the memory array 100 to perform the functions described below. Additionally or alternatively, the memory controller 140 may perform aspects the functions described below using special-purpose hardware. Method 1100 may apply to a multilevel memory cell that may include two or more programmable memory elements.

At block 1105, the method may include applying a first current to the memory cell, where a magnitude of the first current is based at least in part on a melting temperature of the first memory element, and where the melting temperature of the first memory element is less than a melting temperature of the second memory element, as described with reference to FIGS. 1-5. In certain examples, the operations of block 1105 may be performed by the memory controller 140, as described with reference to FIGS. 1, 7, and 8.

At block 1110, the method may include applying a second current to the memory cell, where a magnitude of the second current is based at least in part on the melting temperature of the second memory element, as described with reference to FIGS. 1-5. In certain examples, the operations of block 1110 may be performed by the memory controller 140, as described with reference to FIGS. 1, 7, and 8.

Thus, methods 900, 1000, and 1100 may provide for formation or programming of a multilevel memory cell. It should be noted that methods 900, 1000, and 1100 describe possible implementations, and the operations and steps may be rearranged or otherwise modified such that other implementations are possible. In some examples, aspects from two or more of the methods 900, 1000, and 1100 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

As used herein, "coupled to" indicates components that are substantially in contact with one another. In some cases, two components may be coupled even if a third material or component physically separates them. This third component may not substantially alter the two components or their functions. Instead, this third component may aid or enable the connection of the first two components. For example, some materials may not strongly adhere when deposited on a substrate material. Thin (e.g., on the order of a few nanometers or less) layers, such as lamina layers, may be used between two materials to enhance their formation or connection. In other cases, a third material may act as a buffer to chemically isolate two components.

The term "layer" used herein refers to a stratum or sheet of a geometrical structure. Each layer may have three dimensions (e.g., height, width, and depth) and may cover some or all of a surface below. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "photolithography," as used herein, may refer to the process of patterning using photoresist materials and exposing such materials using electromagnetic radiation. For example, a photoresist material may be formed on a base material by spin-coating the photoresist on the base material. A pattern may be created in the photoresist by exposing the photoresist to radiation. The pattern may be defined by, for example, a photomask that spatially delineates where the radiation exposes the photoresist. Exposed photoresist areas may then be removed, for example, by chemical treatment, leaving behind the desired pattern. In some cases, the exposed regions may remain and the unexposed regions may be removed The term "electronic communication" refers to a relationship between components that supports electron flow between the components. This may include a direct connection between components or may include intermediate components. Components in electronic communication may be actively exchanging elections or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Chalcogenide materials may be materials or alloys that include at least one of the elements sulfur (S), selenium (Se), and tellurium (Te). Phase change materials discussed herein may be chalcogenide materials. Chalcogenide materials and alloys may include, but not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

Transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. Likewise, if the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk, and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A memory cell, comprising:
 a first memory storage element positioned between a first electrode and a second electrode, wherein a logic state of the first memory storage element is based at least in part on whether the first memory storage element comprises an amorphous state or a crystalline state; and
 a second memory storage element positioned between the second electrode and a third electrode, wherein a logic state of the second memory storage element is based at least in part on whether the second memory storage element comprises an amorphous state or a crystalline state, and wherein a melting temperature of the first memory storage element is different from a melting temperature of the second memory storage element.

2. The memory cell of claim 1, wherein an entirety of the first memory storage element and an entirety of the second memory storage element are each configured to one of an amorphous state or a crystalline state.

3. The memory cell of claim 1, wherein the memory cell comprises a multi-level memory cell, and wherein a logic state of the memory cell is based at least in part on the logic state of the first memory storage element and the logic state of the second memory storage element.

4. The memory cell of claim 1, wherein the memory cell comprises a stack comprising the first electrode, the first memory storage element, the second electrode, the second memory storage element, and the third electrode, and wherein the melting temperature of the first memory storage element is less than the melting temperature of the second memory storage element.

5. The memory cell of claim 4, wherein the stack is positioned between a first conductive line and a second conductive line, wherein the third electrode is adjacent the first conductive line and the first electrode is adjacent the second conductive line.

6. The memory cell of claim 1, wherein the first memory storage element and the second memory storage element each comprise a chalcogenide material.

7. The memory cell of claim 1, wherein the first memory storage element and the second memory storage element each comprise a phase change material.

8. The memory cell of claim 1, wherein the first electrode, the second electrode, and the third electrode each comprise a same material.

9. The memory cell of claim 1, wherein the first electrode, the second electrode, and the third electrode each comprise at least one of tungsten, titanium, carbon, tungsten nitride, tungsten carbide, tungsten silicide, tungsten silicon nitride, tungsten carbon nitride, titanium silicon nitride, or any combination thereof.

10. The memory cell of claim 1, further comprising:
 at least one lamina layer positioned between at least one electrode and one memory storage element.

11. A memory cell, comprising:
 a first memory element positioned between a first electrode and a second electrode, wherein a logic state of the first memory element is based at least in part on whether the first memory element comprises an amorphous state or a crystalline state;
 a second memory element positioned between the second electrode and a third electrode, wherein a logic state of the second memory element is based at least in part on whether the second memory element comprises an amorphous state or a crystalline state, and wherein a melting temperature of the first memory element is different from a melting temperature of the second memory element; and
 a third memory element positioned between the third electrode and a fourth electrode, wherein the first electrode, the second electrode, the third electrode, and the fourth electrode comprise a same material, wherein a melting temperature of the first memory element is less than a melting temperature of the second memory element, and the melting temperature of the second memory element is less than a melting temperature of the third memory element.

12. The memory cell of claim 11, further comprising:
 a selection component that comprises an electrically non-linear component, wherein the memory cell comprises a stack comprising the first electrode, the first memory element, the second electrode, the second memory element, the third electrode, and the selection component.

13. A memory cell, comprising:
 a first memory storage element positioned between a first electrode and a second electrode, wherein a logic state of the first memory storage element is based at least in part on whether the first memory storage element comprises an amorphous state or a crystalline state; and
 a second memory storage element positioned between the second electrode and a third electrode, wherein a logic state of the second memory storage element is based at least in part on whether the second memory storage element comprises an amorphous state or a crystalline state, wherein the first electrode, the second electrode, and the third electrode each have a different electrical resistance.

14. The memory cell of claim 13, wherein an entirety of the first memory storage element and an entirety of the second memory storage element are each configured to one of an amorphous state or a crystalline state.

15. The memory cell of claim 13, wherein the memory cell comprises a multi-level memory cell, and wherein a logic state of the memory cell is based at least in part on the logic state of the first memory storage element and the logic state of the second memory storage element.

16. The memory cell of claim 13, wherein the memory cell comprises a stack comprising the first electrode, the first memory storage element, the second electrode, the second memory storage element, and the third electrode, and wherein an electrical resistance of the first electrode is greater than an electrical resistance of the third electrode.

17. The memory cell of claim 13, wherein the first electrode, the second electrode, and the third electrode each comprise materials having different resistivities.

18. The memory cell of claim 13, wherein the first electrode, the second electrode, and the third electrode each comprise a same material, and wherein the different electrical resistance of each electrode is based at least in part on a dimension of the electrode.

19. The memory cell of claim 13, wherein the first memory storage element and the second memory storage element comprise different materials with different melting temperatures.

20. A memory cell, comprising:
a first memory element positioned between a first electrode and a second electrode, wherein a logic state of the first memory element is based at least in part on whether the first memory element comprises an amorphous state or a crystalline state; and
a second memory element positioned between the second electrode and a third electrode, wherein a logic state of the second memory element is based at least in part on whether the second memory element comprises an amorphous state or a crystalline state, wherein the first electrode, the second electrode, and the third electrode each have a different electrical resistance, wherein the first memory element and the second memory element each comprise a same material with a same melting temperature.

21. A memory cell, comprising:
a first memory element positioned between a first electrode and a second electrode, wherein a logic state of the first memory element is based at least in part on whether the first memory element comprises an amorphous state or a crystalline state;
a second memory element positioned between the second electrode and a third electrode, wherein a logic state of the second memory element is based at least in part on whether the second memory element comprises an amorphous state or a crystalline state, wherein the first electrode, the second electrode, and the third electrode each have a different electrical resistance; and
a third memory element positioned between the third electrode and a fourth electrode, wherein the first electrode, the second electrode, and the third electrode each have different electrical resistances, and wherein an electrical resistance of the fourth electrode is the same as or different from an electrical resistance of the third electrode, wherein the first memory element, the second memory element, and the third memory element each comprise a same material with a same melting temperature.

22. A memory cell, comprising:
a first memory element positioned between a first electrode and a second electrode, wherein a logic state of the first memory element is based at least in part on whether the first memory element comprises an amorphous state or a crystalline state; and
a second memory element positioned between the second electrode and a third electrode, wherein a logic state of the second memory element is based at least in part on whether the second memory element comprises an amorphous state or a crystalline state, wherein the first electrode, the second electrode, and the third electrode each have a different electrical resistance; and
a selection component that comprises an electrically non-linear component, wherein the memory cell comprises a stack comprising the first electrode, the first memory element, the second electrode, the second memory element, the third electrode, and the selection component.

23. A method of forming a memory cell, comprising:
forming a stack comprising a plurality of conductive materials, wherein each conductive material of the plurality is separated from another conductive material by a memory storage element material, wherein the stack comprises at least two memory storage element materials;
a first removing of material to form at least one channel in the stack; and
a second removing of material in a direction perpendicular to the first removing to form at least one pillar.

24. The method of claim 23, wherein each conductive material of the plurality of conductive materials comprises a material with a different electrical resistance and the at least two memory storage element materials comprise a same material.

25. The method of claim 23, wherein the plurality of conductive materials comprise a same material and the at least two memory storage element materials comprise different materials.

26. The method of claim 23, further comprising:
forming a first conductive line material;
forming a second conductive line material; and
forming a selection component material, wherein the selection component material and the stack are positioned between the first conductive line material and the second conductive line material, wherein the first conductive line material, the second conductive line material, and the selection component material are formed before the first removing of material.

27. An electronic memory apparatus, comprising:
a memory cell comprising a first memory storage element positioned between a first electrode and a second electrode, and a second memory storage element positioned between the second electrode and a third electrode;
a first conductive line in electronic communication with the memory cell;
a second conductive line in electronic communication with the memory cell; and
a controller in electronic communication with the first conductive line and the second conductive line, wherein the controller is operable to:
apply a first current to the memory cell, wherein a magnitude of the first current is based at least in part on a melting temperature of the first memory storage element, and wherein the melting temperature of the first memory storage element is less than a melting temperature of the second memory storage element, and
apply a second current to the memory cell, wherein a magnitude of the second current is based at least in part on the melting temperature of the second memory storage element.

* * * * *